United States Patent
D'Evelyn

(10) Patent No.: US 8,979,999 B2
(45) Date of Patent: Mar. 17, 2015

(54) PROCESS FOR LARGE-SCALE AMMONOTHERMAL MANUFACTURING OF GALLIUM NITRIDE BOULES

(75) Inventor: Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 12/534,844

(22) Filed: Aug. 3, 2009

(65) Prior Publication Data

US 2010/0031875 A1 Feb. 11, 2010

Related U.S. Application Data

(60) Provisional application No. 61/087,122, filed on Aug. 7, 2008.

(51) Int. Cl.
| C30B 7/10 | (2006.01) |
|---|---|
| C30B 29/40 | (2006.01) |
| B01J 3/00 | (2006.01) |
| B01J 3/04 | (2006.01) |
| B01J 3/06 | (2006.01) |
| B30B 11/00 | (2006.01) |

(52) U.S. Cl.
CPC ............... *C30B 29/406* (2013.01); *B01J 3/008* (2013.01); *B01J 3/042* (2013.01); *B01J 3/065* (2013.01); *C30B 7/10* (2013.01); *B30B 11/002* (2013.01); *B01J 2203/0665* (2013.01); *B01J 2203/068* (2013.01)
USPC ............ 117/68; 117/70; 117/71; 117/72; 117/74; 117/76

(58) Field of Classification Search
USPC .............................. 117/68, 70, 71, 72, 74, 76
See application file for complete search history.

(56) References Cited

U.S. PATENT DOCUMENTS

| 3,245,760 A | 4/1966 | Sawyer |
| 3,303,053 A | 2/1967 | Strong et al. |
| 3,335,084 A | 8/1967 | Hall |
| 4,030,966 A | 6/1977 | Hornig et al. |
| 4,066,868 A | 1/1978 | Witkin et al. |

(Continued)

FOREIGN PATENT DOCUMENTS

| CN | 101061570 | 10/2007 |
| CN | 101061570 | 12/2009 |

(Continued)

OTHER PUBLICATIONS

Dwiliński et al, Ammono Method of BN, AlN, and GaN Synthesis and Crystal Growth,: Journal of Nitride Semiconductor Research, 1998, 3,25, MRS, Internet: http://nsr.mij.mrs.org.

(Continued)

*Primary Examiner* — Bob M Kunemund
(74) *Attorney, Agent, or Firm* — Kilpatrick Townsend & Stockton LLP

(57) ABSTRACT

A method for large-scale manufacturing of gallium nitride boules. Large-area single crystal seed plates are suspended in a rack, placed in a large diameter autoclave or internally-heated high pressure apparatus along with ammonia and a mineralizer, and grown ammonothermally. The seed orientation and mounting geometry are chosen to provide efficient utilization of the seed plates and of the volume inside the autoclave or high pressure apparatus. The method is scalable up to very large volumes and is cost effective.

16 Claims, 13 Drawing Sheets

Crystal slicing (edge view)

(a) m-plane oriented seeds

(56) References Cited

U.S. PATENT DOCUMENTS

| | | |
|---|---|---|
| 4,350,560 A | 9/1982 | Helgeland et al. |
| 4,430,051 A | 2/1984 | Von Platen |
| 5,098,673 A | 3/1992 | Engel et al. |
| 5,169,486 A | 12/1992 | Young et al. |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn et al. |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Saak et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall et al. |
| 7,009,215 B2 | 3/2006 | D'Evelyn et al. |
| 7,012,279 B2 | 3/2006 | Wierer Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwilinski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2005/0087753 A1 | 4/2005 | D'Evelyn et al. |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |

(56) References Cited

U.S. PATENT DOCUMENTS

| | | |
|---|---|---|
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park |
| 2007/0142204 A1 | 6/2007 | Park et al. |
| 2007/0151509 A1 | 7/2007 | Park |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn et al. |
| 2009/0320745 A1 | 12/2009 | D'Evelyn et al. |
| 2010/0000492 A1 | 1/2010 | Ambardekar |
| 2010/0001300 A1 | 1/2010 | Raring et al. |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0073494 A1 | 3/2012 | D'Evelyn |
| 2012/0091465 A1 | 4/2012 | Krames et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0119401 A1 | 5/2013 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |

FOREIGN PATENT DOCUMENTS

| | | |
|---|---|---|
| JP | 2005-289797 A2 | 10/2005 |
| JP | 2007-039321 A | 2/2007 |
| WO | WO 2005121415 A1 | 12/2005 |
| WO | WO 2006/038467 | 4/2006 |
| WO | 2006/057463 | 6/2006 |
| WO | WO2007-004495 | 1/2007 |
| WO | WO 2010/068916 | 6/2010 |
| WO | WO2012-016033 | 2/2012 |

OTHER PUBLICATIONS

Kolis et al., "Crystal Growth of Gallium Nitride in Supercritical Ammonia," Journal of Crystal Growth, 2001, vol. 222, pp. 431-434.
Kolis et al., "Materials Chemistry and Bulk Crystal Growth of Group III Nitrides in Supercritical Ammonia" Mat. Res. Soc. Symp. Proc., 1998, vol. 495, pp. 367-372.
Motoki et al. "Growth and Characterization of Freestanding GaN Substrates," Journal of Crystal Growth, 2002, vol. 237-239, pp. 912-921.
Peters, "Ammonothermal Synthesis of Aluminium Nitride," Journal of Crystal Growth, 1999, vol. 4, pp. 411-418.
International Search Report & Written Opinion of PCT Application No. PCT/US/09/52750, date of mailing Oct. 6, 2009, 13 pages total.
USPTO Notice of Allowance for U.S. Appl. No. 12/534,843 dated Jan. 24, 2013.
Communication from the Polish Patent Office re P394857 dated Jan. 22, 2013, 2 pages.
USPTO Notice of Allowance for U.S. Appl. No. 12/634,665 dated Feb. 15, 2013.
USPTO Office Action for U.S. Appl. No. 13/041,199 dated Mar. 12, 2013.
USPTO Notice of Allowance for U.S. Appl. No. 13/226,249 dated Feb. 21, 2013.
Office action for U.S. Appl. No. 12/497,969 (Feb. 2, 2012).
Office action for U.S. Appl. No. 12/478,736 (Feb. 7, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).
Office action for U.S. Appl. No. 12/491,176 (Mar. 1, 2012).
Fukuda et al. "Prospects for the ammonothermal growth of large GaN crystal," Journal of Crystal Growth 305: 304-310 (Jul. 2007).

(56) References Cited

OTHER PUBLICATIONS

Copel et al., 'Surfactants in Epitaxial Growth', Physical Review Letters, Aug. 7, 1989, vol. 63, No. 6, p. 632-635.
Lu et al., 'Structure of the CI-passivated GaAs(111) surface', Physical Review B, Nov. 15, 1998, vol. 58, No. 20, pp. 13820-13823.
Massies et al., 'Surfactant mediated epitaxial growth of InxGa1-xAs on GaAs (001)', Applied Physics Letters, vol. 61, No. 1, Jul. 6, 1992, pp. 99-101.
Sumiya et al., 'High-pressure synthesis of high-purity diamond crystal', Diamond and Related Materials, 1996, vol. 5, pp. 1359-1365.
Communication from the Chinese Patent Office re 200980134876.2 dated Jul. 3, 2013, 14 pages.
Communication from the Polish Patent Office re P394857 dated Aug. 14, 2013, 2 pages.
USPTO Office Action for U.S. Appl. No. 12/133,365 dated Aug. 21, 2013, 29 pages.
USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/272,981 dated Aug. 15, 2013, 13 pages.
Choi et al., '2.51 microcavity InGaN light-emitting diodes fabricated by a selective dry-etch thinning process', Applied Physics Letters, 2007, 91(6), 061120.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Notice of Allowance for U.S. Appl. No. 12/478,736 dated Oct. 9, 2012.
USPTO Notice of Allowance for U.S. Appl. No. 12/569,337 dated Nov. 15, 2012.
USPTO Office Action for U.S. Appl. No. 12/569,844 dated Oct. 12, 2012.
USPTO Office Action for U.S. Appl. No. 12/634,665 dated Oct. 1, 2012.
USPTO Office Action for U.S. Appl. No. 12/891,668 dated Sep. 25, 2012.
USPTO Office Action for U.S. Appl. No. 13/025,833 dated Jul. 12, 2012.
USPTO Office Action for U.S. Appl. No. 13/041,199 dated Nov. 30, 2012.
USPTO Office Action for U.S. Appl. No. 13/175,739 dated Dec. 7, 2012.
USPTO Office Action for U.S. Appl. No. 13/179,346 dated Dec. 13, 2012.
USPTO Office Action for U.S. Appl. No. 13/226,249 dated Oct. 10, 2012.
USPTO Office Action for U.S. Appl. No. 13/472,356 dated Dec. 9, 2013 (11 pages).
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table For: Non-Ferrous Metals: Other Metals: Molybdenum.
Pattison et al., 'Gallium Nitride Based Microcavity Light Emitting Diodes With 2λ, Effective Cavity Thickness', Applied Physics Letters, vol. 90, Issue 3, 031111 (2007) 3pg.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Notice of Allowance for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Office Action for U.S. Appl. No. 12/634,665 dated Apr. 25, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
Chiang et al. "Luminescent Properties of Cerium-Activated Garnet Series Phosphor: Structure and Temperature Effects," Journal of the Electrochemical Society 155:B517-B520 (2008).
Chiu et al. "Synthesis and Luminescence Properties of Intensely Red-Emitting M5Eu $(WO_4)_{4-x}$ $(MoO_4)_x$(M=Li, Na, K) Phosphors," Journal of the Electrochemical Society 15:J71-J78 (2008).

(56) References Cited

OTHER PUBLICATIONS

Ci et al. "$Ca_{1-x}Mo_{1-y}Nb_yO_4:Eu_x^{3+}$: A novel red phosphor for white light emitting diodes," Journal of Physics 152:670-674 (2008).
Happek "Development of Efficient UV-LED Phosphor Coatings for Energy Saving Solid State Lighting" University of Georgia (Jan. 2007).
Höppe et al. "Luminescence in $Eu^{2+}$-doped $Ba_2Si_5N_8$: fluorescence, thernoliminescence, and upconversion"; Journal of Physics and Chemistry of Solids 61:2001-2006 (2000).
Li et al. "The effect of replacement of Sr by Ca on the structural and luminescence properties of the red-emitting $Sr_2Si_5N_8:Eu_2+$ LED conversion phosphor," Journal of Solid State Chemistry 181:515-524 (2008).
Mueller-Mach et al. "Highly efficient all-nitride phosphor-converted white light emitting diode," Physica Status Solidi (a) 202:1727-1732 (Jul. 2005).
Setlur et al. "Crystal chemistry and luminescence of $Ce^{3+}$-doped $(Lu_2CaMg_2)-Ca-2(Si, Ge)_3O_{12}$ and its use in LED based lighting," Chemistry of Materials 18: 3314-3322 (2006).
Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).
Yamamoto "White LED phosphors: the next step," Proceeding of . SPIE (2010).
Yang et al. "Preparation and luminescence properties of LED conversion novel phosphors $SrZnO_2:Sm$," Materials Letters 62:907-910 (Mar. 2008).
Altoukhov et al., 'High reflectivity airgap distributed Bragg reflectors realized by wet etching of AlInN sacrificial layers', Applied Physics Letters, vol. 95, 2009, pp. 191102-1-3.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.
Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and optical properties of bulk GaN crystals fabricated through hydride vapor phase epitaxy with void-assisted separation', Journal of Applied Physics, 98, 2005, pp. 103509-1-103509-4.
International Search Report of PCT Application No. PCT/US2009/067745, dated Feb. 5, 2010, 1 page total.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
USPTO Office Action for U.S. Appl. No. 12/133,365 dated May 13, 2013.
USPTO Office Action for U.S. Appl. No. 12/497,969 dated May 16, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
Byrappa et al., "Handbook of Hydrothermal Technology: A Technology for Crystal Growth and Materials Processing," Noyes Publications, Park Ridge, New Jersey, 2001, pp. 94-96 and 152.
Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.
D'Evelyn et al., "Bulk GaN Crystal Growth by the High-Pressure Ammonothermal Method," Journal of Crystal Growth, 2007, vol. 300, pp. 11-16.
Dwilinski et al., "Excellent Crystallinity of Truly Bulk Ammonothermal GaN," Journal of Crystal Growth, 2008, vol. 310, pp. 3911-3916.
Ehrentraut et al., "Prospects for the Ammonothermal Growth of Large GaN Crystal," Journal of Crystal Growth, 2007, vol. 305, pp. 304-310.
Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.
Feezell et al., "AlGaN-Cladding-Free Nonpolar InGaN/GaN Laser Diodes," Japanese Journal of Applied Physics, vol. 46, No. 13, pp. L284-L286.
Frayssinet et al., "Evidence of Free Carrier Concentration Gradient Along the c-axis for Undoped GaN Single Crystals," Journal of Crystal Growth, 2001, vol. 230, pp. 442-447.
Hashimoto et al. "Ammonothermal growth of bulk GaN," Journal of Crystal Growth 310:3907-3910 (Aug. 2008).
Hashimoto et al. "A GaN bulk crystal wit improved structural quality grown by the ammonothermal method," Nature Materials 6:568-671 (Jul. 2007).
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kim et al, "Improved Electroluminescence on Nonpolar m-plane InGaN/GaN Qantum Well LEDs", 2007, Physica Status Solidi (RRL), vol. 1, No. 3, pp. 125-127.
Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.
Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.
Mirwald et al., "Low-Friction Cell for Piston-Cylinder High Pressure Apparatus," Journal of Geophysical Research, 1975, vol. 80, No. 11, pp. 1519-1525.
Murota et al., "Solid State Light Source Fabricated with YAG:Ce Single Crystal," 2002, Japanese Journal of Applied Physics, vol. 46, No. 41, Part 2, No. 8A, pp. L887-L888.
Okamoto et al., "Continuous-Wave Operation of m-Plane InGaN Multiple Quantum Well Laser Diodes," 2007, Japanese Journal of Applied Physics, vol. 46, No. 9, pp. L187-L189.
Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820- L822.

(56) References Cited

OTHER PUBLICATIONS

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Sarva, et al. "Dynamic compressive strength of silicon carbide under uniaxial compression," Mat. Sci. & Eng. A 317,140 (2001).

Sato et al., "High Power and High Efficiency Green Light Emitting Diode on free-Standing Semipolar (1122) Bulk GaN Substrate," 2007.Physica Status Solidi (RRL), vol. 1, pp. 162-164.

Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.

Schmidt et al., "Demonstration of Nonpolar m-Plane InGaN/GaN Laser Diodes ," 2007, Japanese Journal of Applied Physics, vol. 46, No. 9, L190-L191.

Sizov et al., "500-nm Optical Gain Anisotropy of Semipolar (1122) InGaN Quantum Wells," 2009, Applied Physics Express, vol. 2, pp. 071001-1-071001-3.

Tsuda et al., "Blue Laser Diodes Fabricated on m-Plane GaN Substrates," 2008, Applied Physics Express, vol. 1, pp. 011104-011104-03.

Tyagi et al., "Semipolar (1011) InGaN/GaN Laser Diodes on Bulk GaN Substrates," 2007, Japanese Journal of Applied Physics, vol. 46, No. 19, pp. L444-L445.

Wang et al. "Ammonothermal growth of GaN crystals in alkaline solutions," Journal of crystal Growth 287:376-380 (Jan. 2006).

Wang et al., "Ammonothermal Synthesis of III-Nitride Crystals," Crystal Growth & Design, 2006, vol. 6, Issue No. 6, pp. 1227-1246.

Wang et al., "Synthesis of Dense Polycrystaline GaN of High Purity by the Chemical Vapor Reaction Process," Journal of Crystal Growth, 2006, vol. 286, pp. 50-54.

Zhong et al., "Demonstration of High Power Blue-Green Light Emitting Diode on Semipolar (1122) Bulk GaN Substrate," 2007, Electron Letter, vol. 43, No. 15, pp. 825-826.

Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.

USPTO Office Action for U.S. Appl. No. 12/133,365 dated Feb. 20, 2014, 32 pages.

USPTO Office Action for U.S. Appl. No. 12/636,683 dated Feb. 24, 2014, 16 pages.

USPTO Notice of Allowance for U.S. Appl. No. 13/272,981 dated Mar. 13, 2014, 10 pages.

Communication from the Chinese Patent Office re 200980134876.2 dated Aug. 21, 2014 (10 pages).

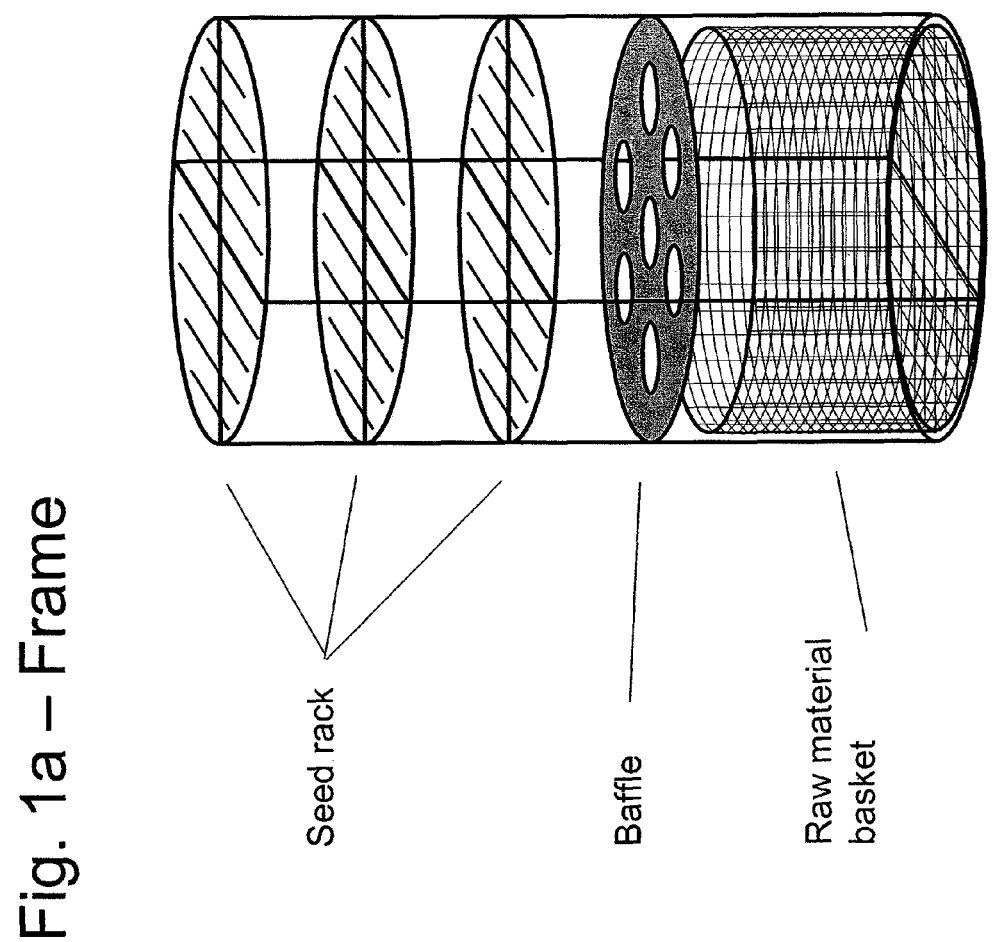
Fig. 1a – Frame

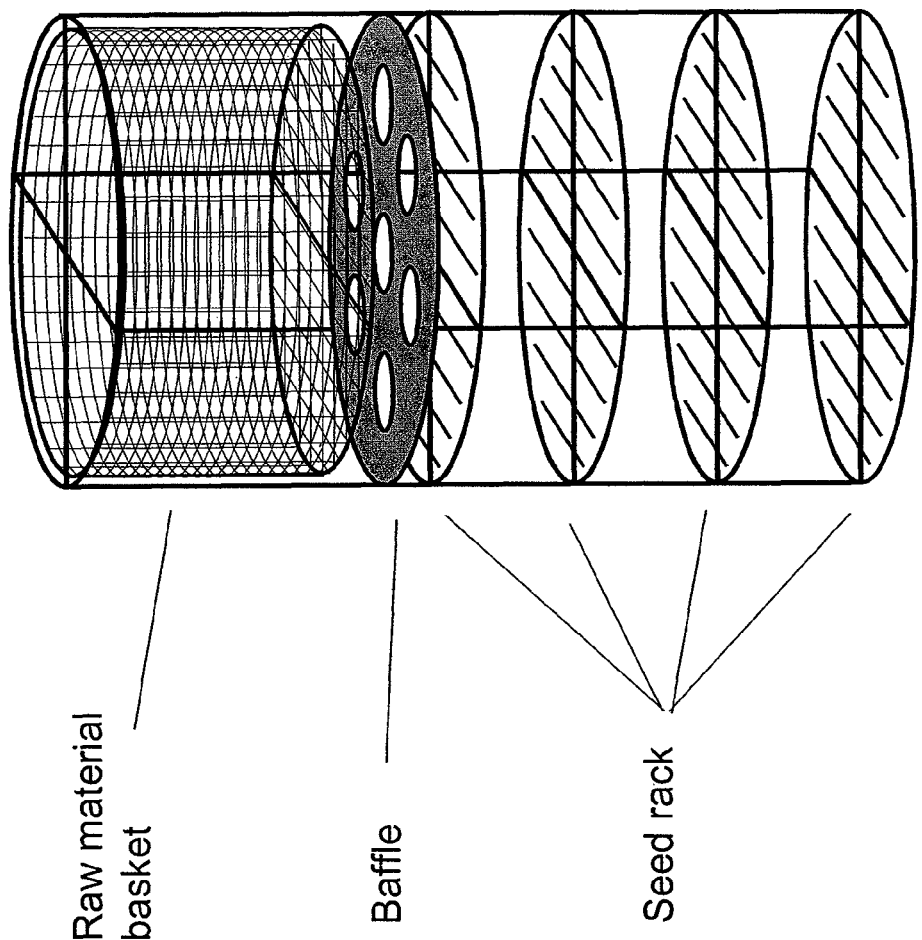
Fig. 1b – Frame
Raw material basket
Baffle
Seed rack

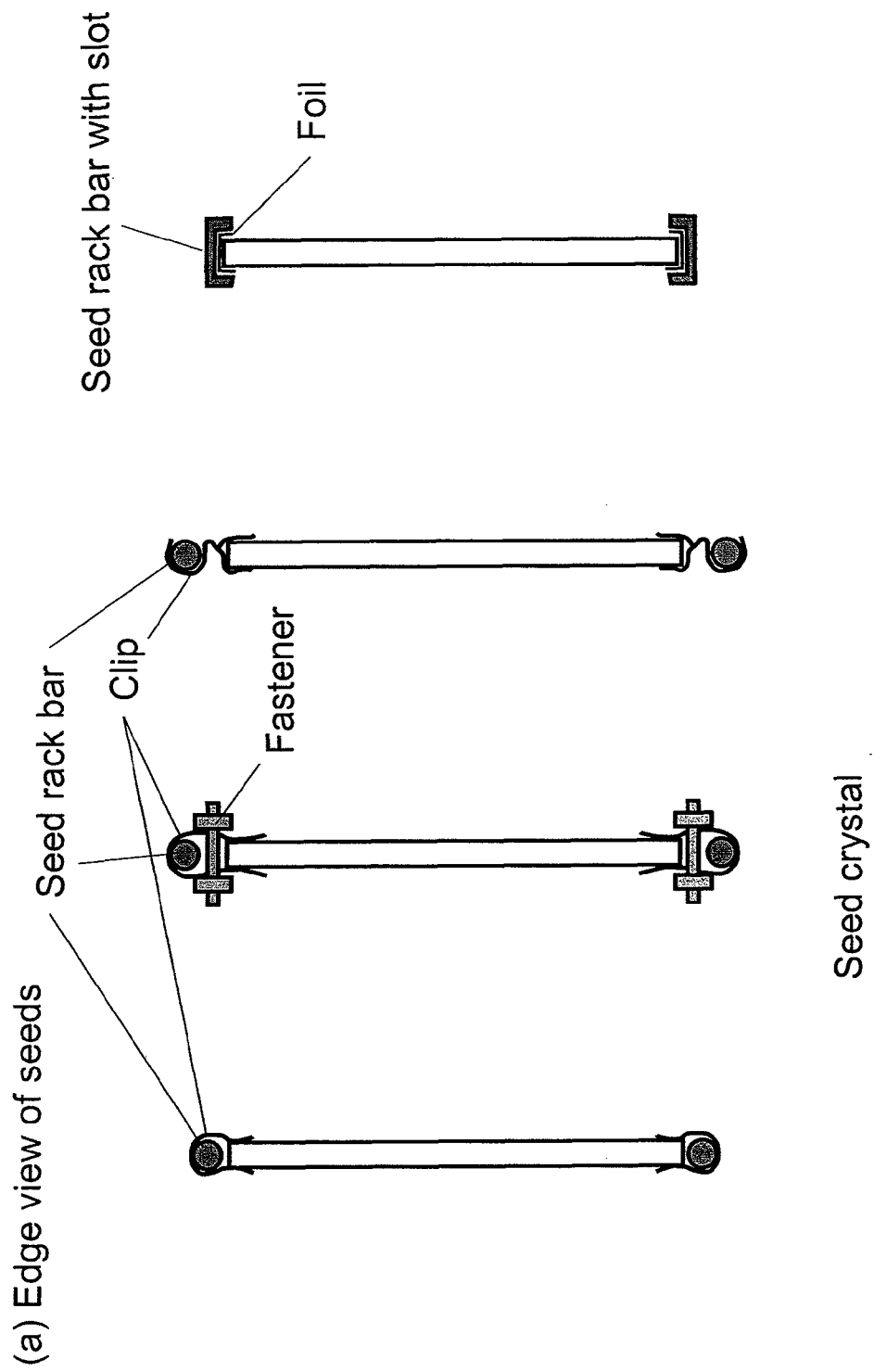
Fig. 2a – Seed attachment

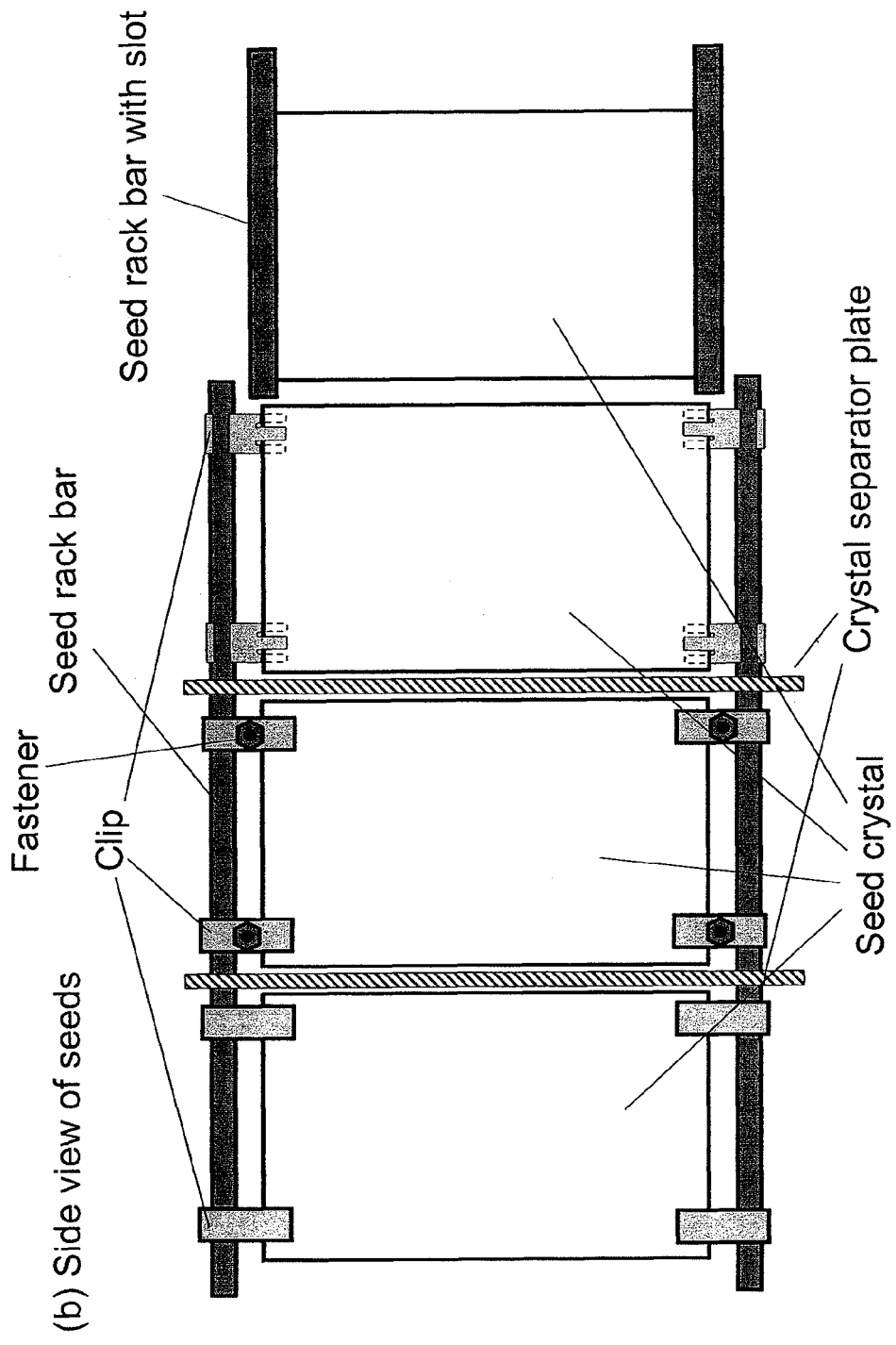
Fig. 2b – Seed attachment
(b) Side view of seeds

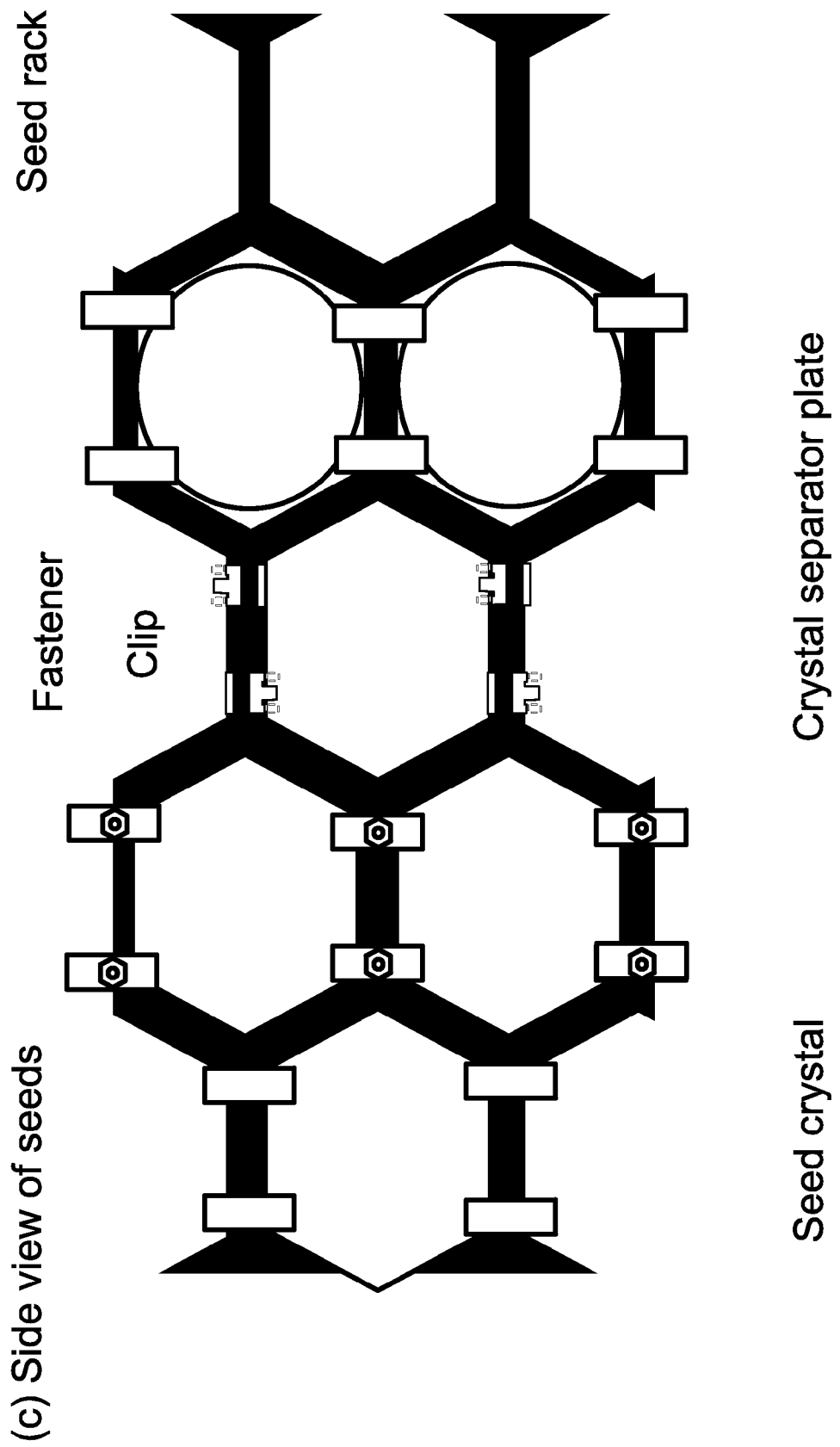
Fig. 2c – Seed attachment
(c) Side view of seeds

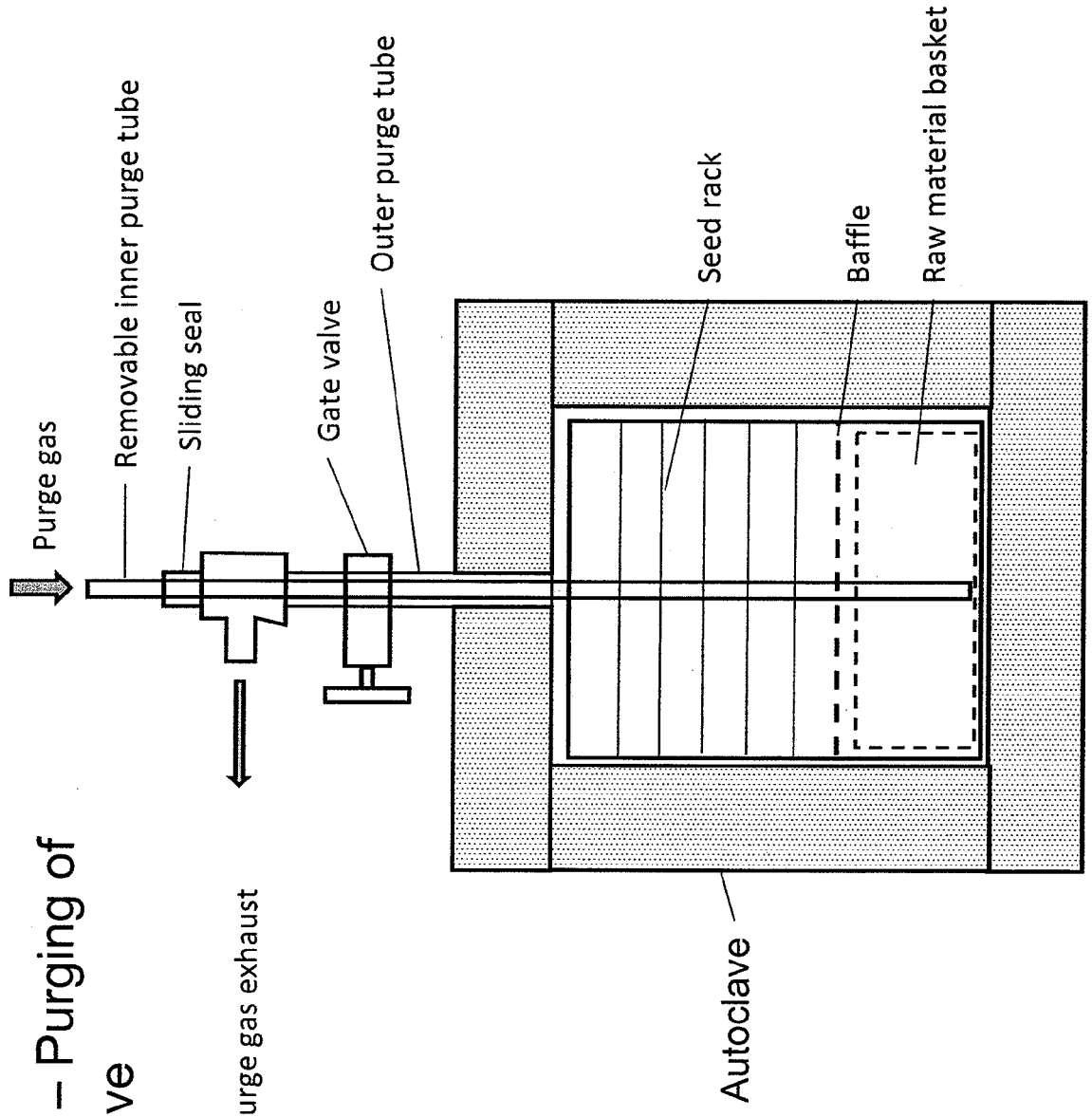

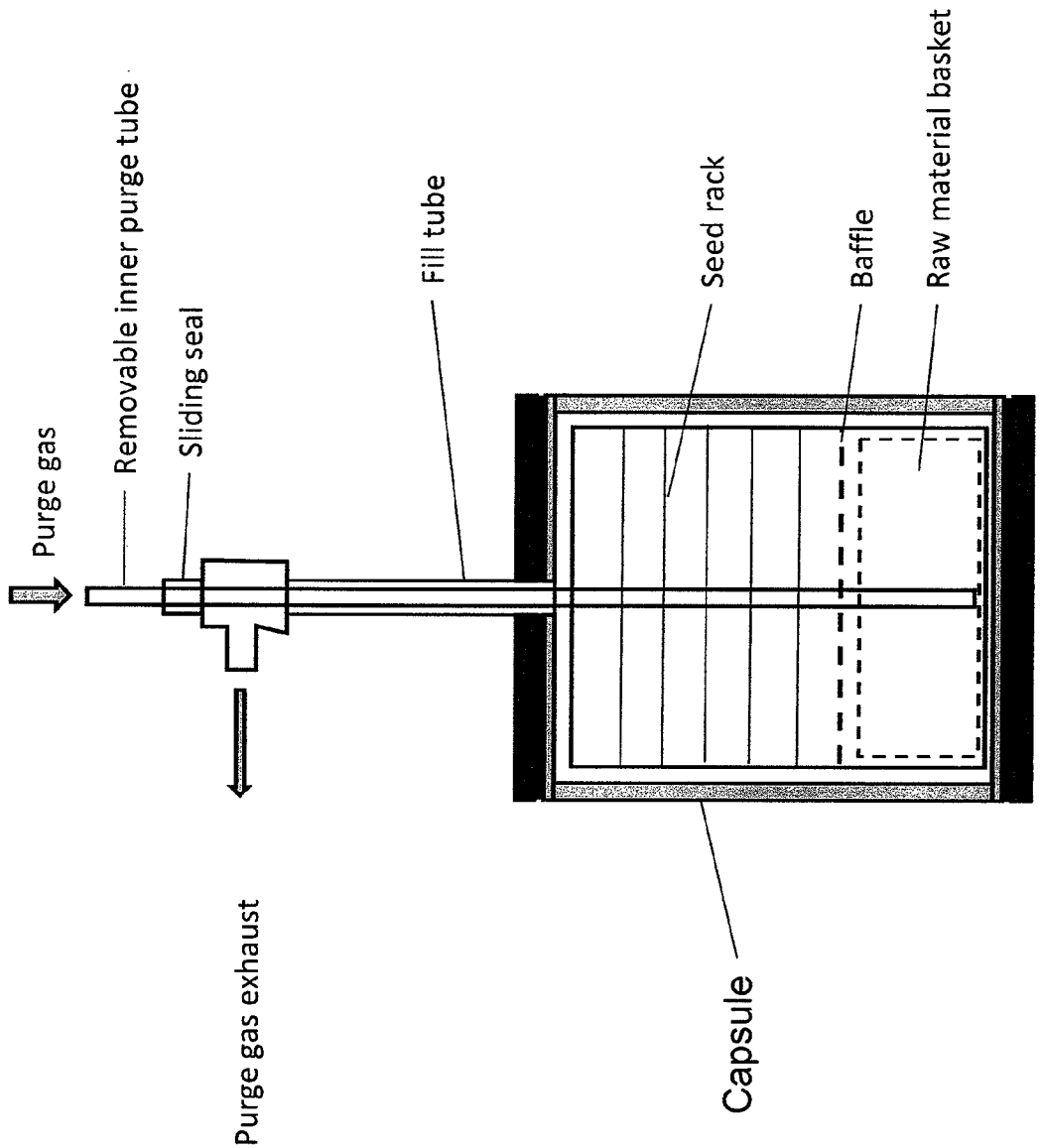
Fig. 3b – Purging of capsule

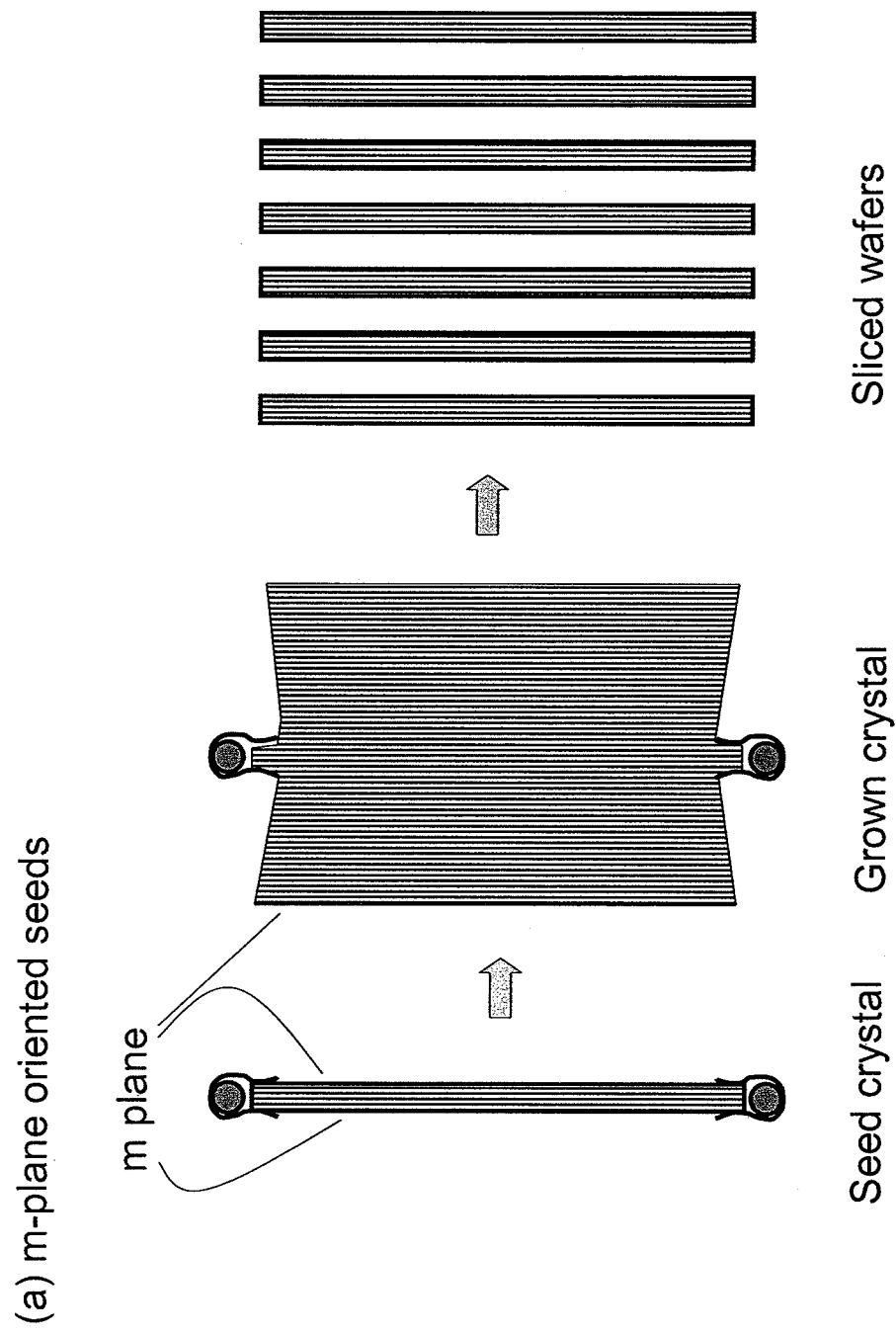
Fig. 4a – Crystal slicing (edge view)
(a) m-plane oriented seeds

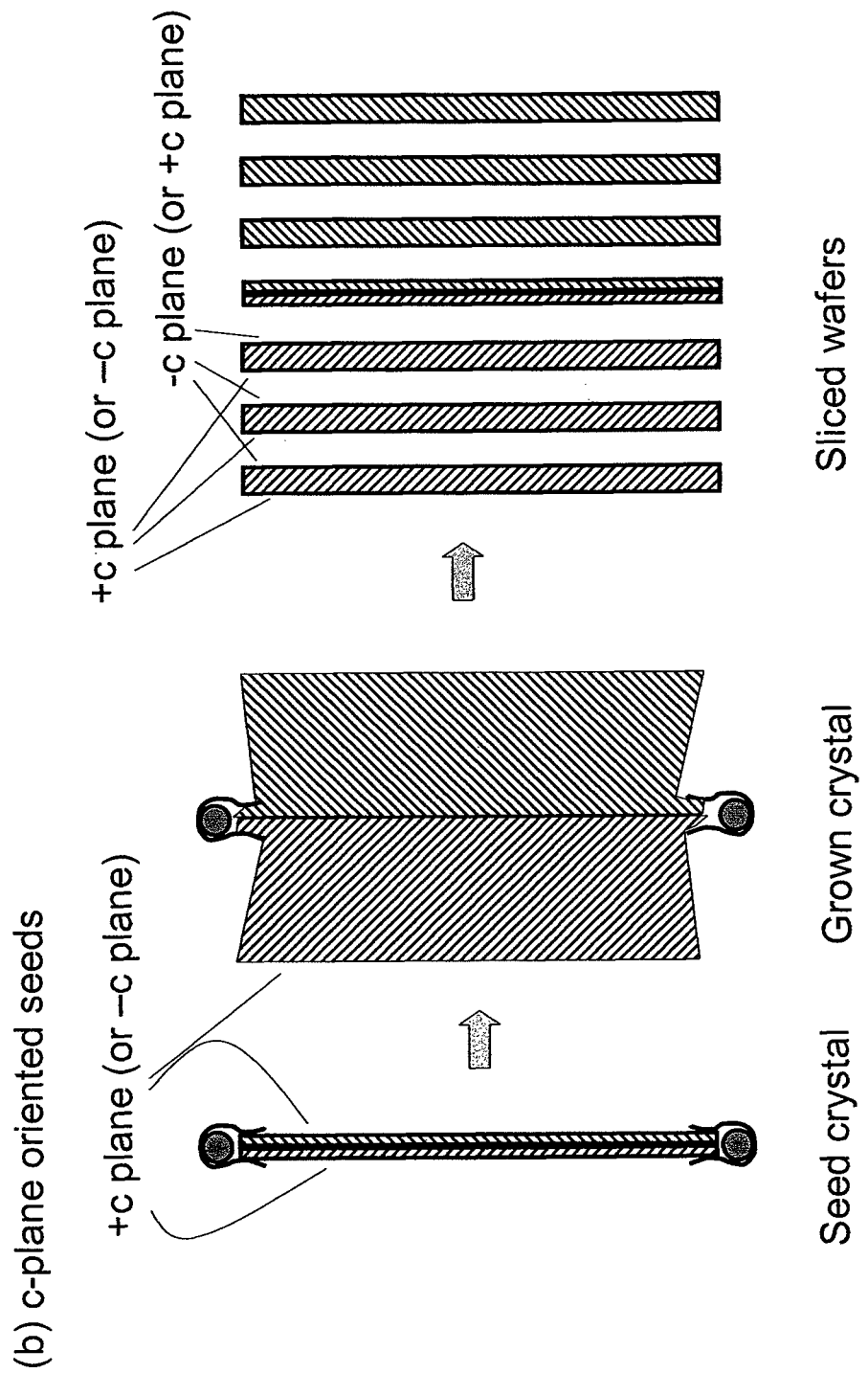

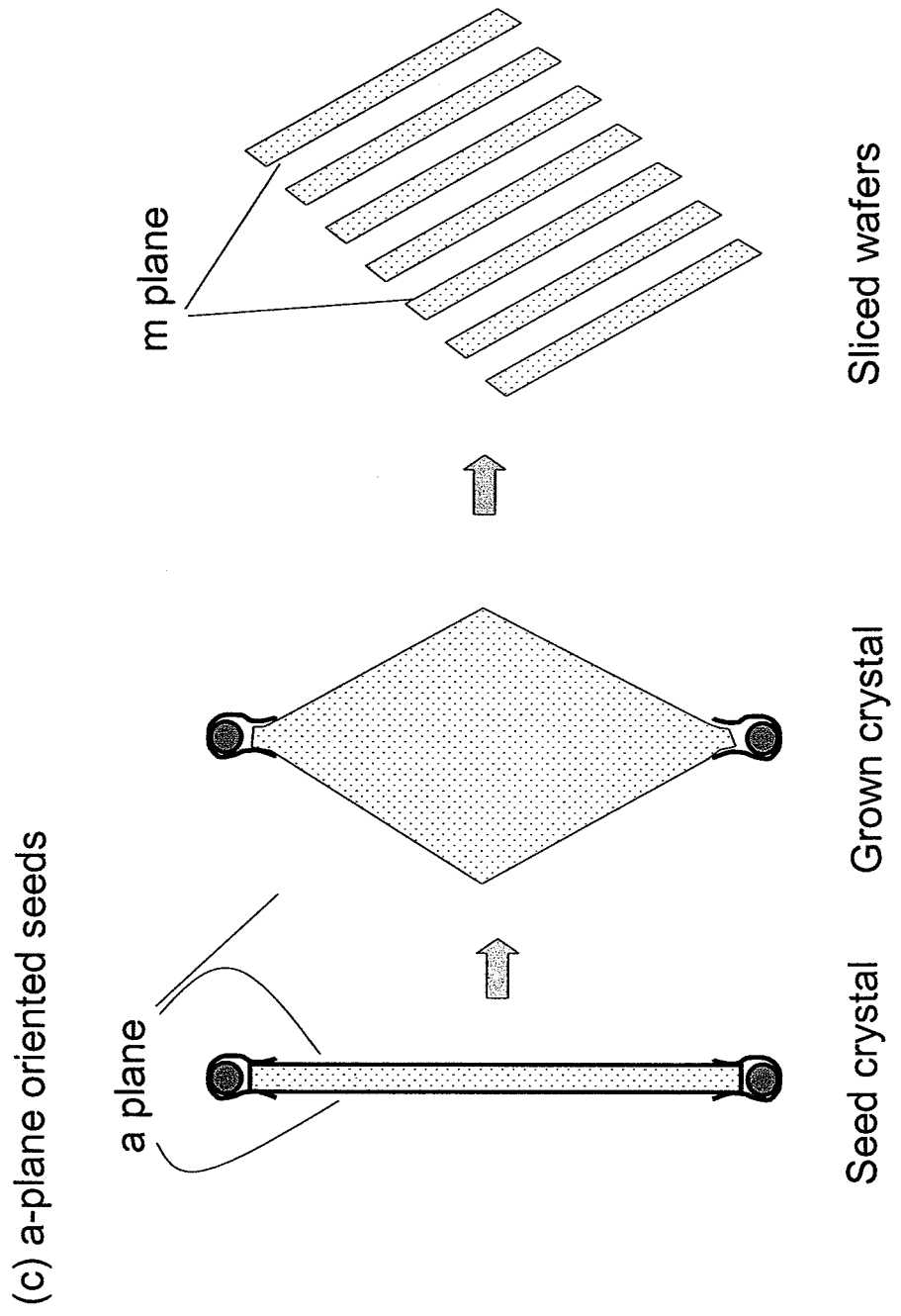

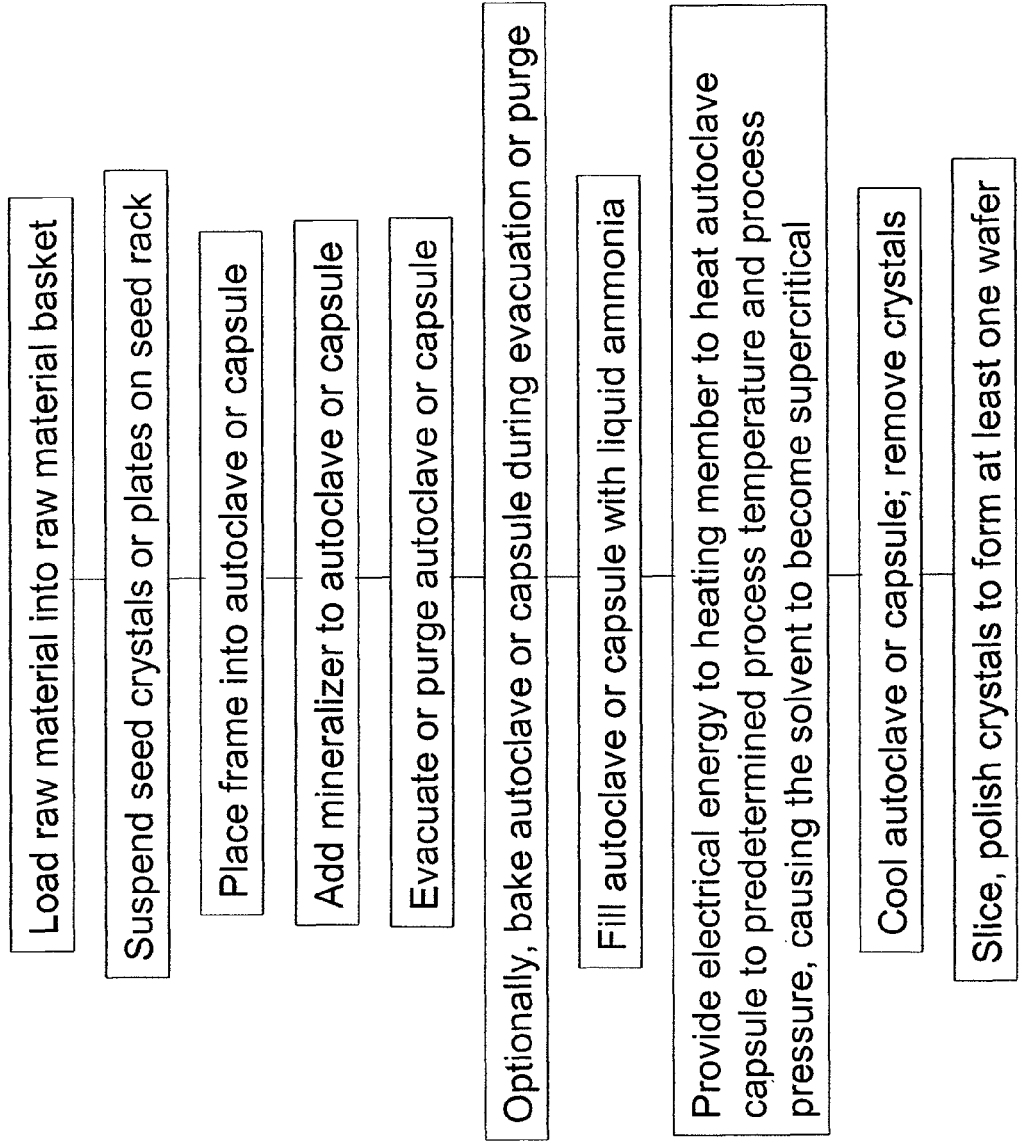
Fig. 5 – Flow diagram

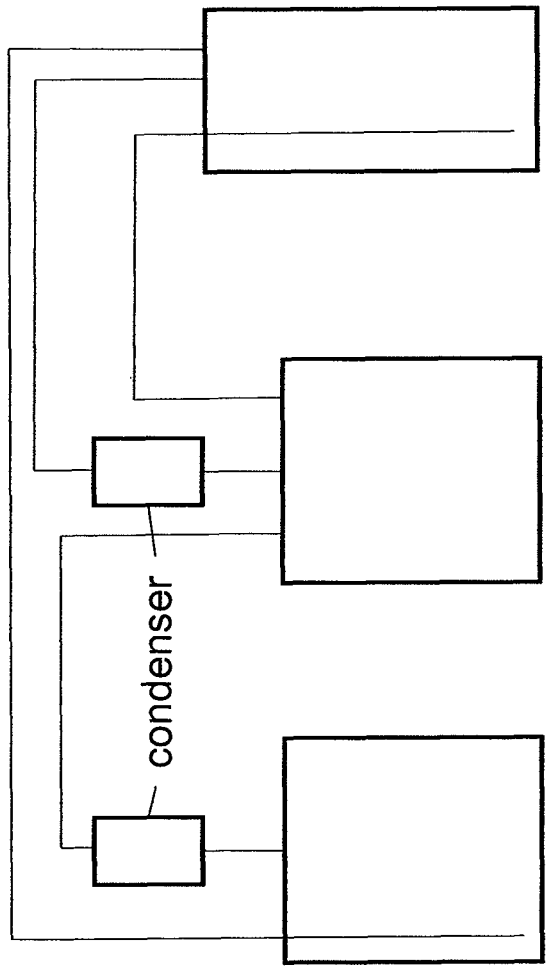
Fig. 6a – Ammonia removal & recycling
(a) single-ended autoclave or capsule
Delivery tank   Receiving/purification tank   Autoclave or capsule
condenser

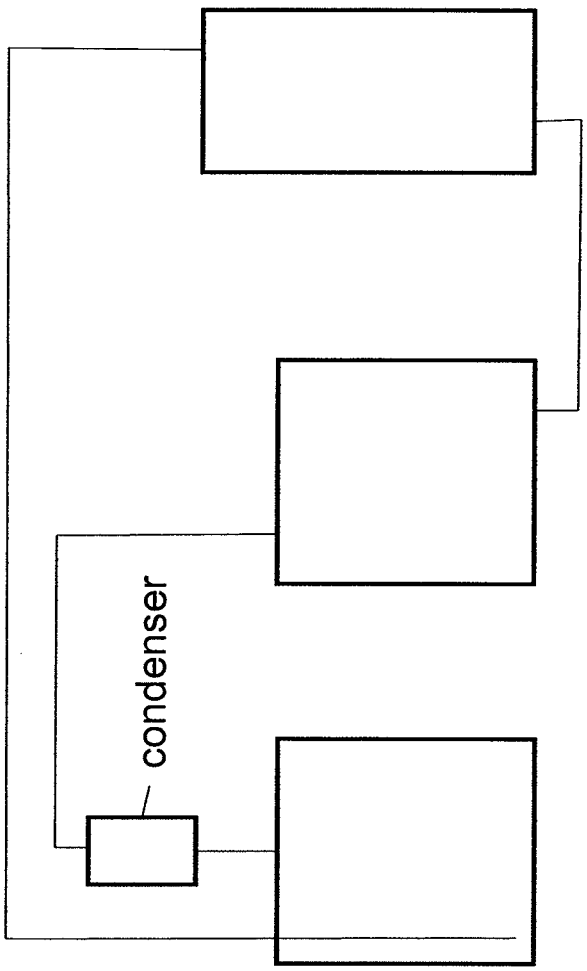
Fig. 6b – Ammonia removal & recycling
(b) double-ended autoclave or capsule
Delivery tank   Receiving/purification tank   Autoclave or capsule

PROCESS FOR LARGE-SCALE AMMONOTHERMAL MANUFACTURING OF GALLIUM NITRIDE BOULES

CROSS-REFERENCES TO RELATED APPLICATIONS

This application claims priority to U.S. Provisional Application No. 61/087,122 filed Aug. 7, 2008, commonly assigned and incorporated by reference in its entirely herein for all purposes. This application is also related to U.S. Patent Application Nos. 61/073,687, 61/078,704, Ser. Nos. 12/133,365, and 12/133,364, commonly assigned and incorporated by reference in its entirely herein for all purposes. This application is also related to U.S. Pat. Nos. 3,245,760, 6,656,615, 6,861,130, 7,078,731, 7,101,433, 7,125,453, 7,160,388, and 7,335,262, and in U.S. published Patent Application Nos. 2006/01777362, 2007/0142204, and 2007/0234946, all of which are hereby incorporated by reference in their entirety for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention generally relates to processing of materials for growth of crystals. More particularly, the present invention provides a method for obtaining a gallium-containing nitride crystal by an ammonobasic or ammonoacidic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Gallium nitride containing crystalline materials serve as a starting point for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Other techniques have been proposed for obtaining bulk monocrystalline gallium nitride. Such techniques include use of epitaxial deposition employing halides and hydrides in a vapor phase and is called Hydride Vapor Phase Epitaxy (HVPE) ["Growth and characterization of freestanding GaN substrates" K. Motoku et al., Journal of Crystal Growth 237-239, 912 (2002)]. Unfortunately, drawbacks exist with HVPE techniques. In some cases, the quality of the bulk monocrystalline gallium nitride is not generally sufficient for high quality laser diodes because of issues with dislocation density, stress, and the like.

Techniques using supercritical ammonia have been proposed. Peters has described the ammonothermal synthesis of aluminum nitride [J. Cryst. Growth 104, 411-418 (1990)]. R. Dwiliński et al. have shown, in particular, that it is possible to obtain a fine-crystalline gallium nitride by a synthesis from gallium and ammonia, provided that the latter contains alkali metal amides ($KNH_2$ or $LiNH_2$). These and other techniques have been described in "AMMONO method of BN, AlN, and GaN synthesis and crystal growth", Proc. EGW-3, Warsaw, Jun. 22 24, 1998, MRS Internet Journal of Nitride Semiconductor Research, http://nsr.mij.mrs.org/3/25, "Crystal growth of gallium nitride in supercritical ammonia" J. W. Kolis et al., J. Cryst. Growth 222, 431-434 (2001), and Mat. Res. Soc. Symp. Proc. Vol. 495, 367-372 (1998) by J. W. Kolis et al. However, using these supercritical ammonia processes, no wide scale production of bulk monocrystalline was achieved.

Dwiliński, in U.S. Pat. Nos. 6,656,615 and 7,335,262, and D'Evelyn, in U.S. Pat. Nos. 7,078,731 and 7,101,433, discuss apparatus and methods for conventional ammonothermal crystal growth of GaN. These methods are useful for growth of relatively small GaN crystals. Unfortunately, such methods have limitations for large scale manufacturing. The conventional apparatus with an inner diameter of 40 mm is useful for growing smaller diameter GaN crystals but is not suitable for large scale growth of GaN boules. Additionally, conventional suspension of seed crystals using wires passing through single laser-drilled holes may be adequate for small crystals but is likely to be tedious and ineffective for large scale manufacturing. Other limitations may also exist.

From the above, it is seen that techniques for large scale crystal growth are highly desired.

BRIEF SUMMARY OF THE INVENTION

According to the present invention, techniques related to processing of materials for growth of crystal are provided. More particularly, the present invention provides a method for obtaining a gallium-containing nitride crystal by an ammonobasic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present invention provides a method for growth of a gallium-containing nitride crystal, e.g., GaN. The method includes providing gallium-containing source material and providing a mineralizer. In a specific embodiment, the method includes providing at least two seed plates, including a first seed plate and a second seed plate. The method includes supporting the first seed plate and the second seed plate in a first site and a second site of a seed rack. In a preferred embodiment, the first seed plate and the second seed plate have substantially an equivalent crystallographic orientation to within five degrees. Each of the first seed plate and the second seed plate have a length of at least 1 centimeter according to a specific embodiment. The method includes placing the source material, mineralizer, and seed plates in a sealable container and introducing a nitrogen containing solvent into the sealable container. In a specific embodiment, the method includes processing the source material, mineralizer, and seed plates contained in the sealable container in a supercritical fluid at a temperature higher than about 400 degrees Celsius and a pressure higher than about 2 kbar.

In an alternative specific embodiment, the present invention provides a method for growth a gallium-containing nitride crystal. The method includes providing gallium-containing source material and providing a mineralizer. The method also includes providing at least a first seed plate and a second seed plate. In a specific embodiment, the first seed plate has a first side having a first crystallographic orientation and a second side has a second crystallographic orientation. In a specific embodiment, the second seed plate has a first side having a first crystallographic orientation and a second side has a second crystallographic orientation. In a specific embodiment, the method also includes supporting the first seed plate and the second seed plate such that the first side of the first seed crystal faces the first side of the second seed crystal and spaced by a predetermined gap between the first side of the first seed crystal and the first side of the second seed crystal. The method includes placing the source material, mineralizer, and the seed plates in a sealable container. The method introduces a nitrogen-containing solvent in the sealable container and processes the source material, mineralizer, and seed plates contained in the sealable container in a supercritical fluid at a temperature higher than about 400 degrees Celsius and a pressure higher than about 2 kbar.

Still further, the present invention provides a method for growth a gallium-containing nitride crystal, e.g., GaN. The method includes providing gallium-containing source material. In a specific embodiment, the method also includes providing a mineralizer and providing at least a first seed plate and a second seed plate. In a specific embodiment, the first seed plate has a first side having a first a-plane crystallographic orientation and a second side has a second a-plane crystallographic orientation. In a specific embodiment, the second seed plate has a first side having a first a-plane crystallographic orientation and a second side has a second a-plane crystallographic orientation. In a specific embodiment, the method includes supporting the first seed plate and the second seed plate. Each of the first seed plate and the second seed plate has a length of at least 1 centimeters according to a specific embodiment. In a specific embodiment, the method includes placing the source material, mineralizer, and the seed plates in a sealable container and introducing a nitrogen-containing solvent in the sealable container. In a preferred embodiment, the method includes processing the source material, mineralizer, and seed plates contained in the sealable container in a supercritical fluid at a temperature higher than about 400 degrees Celsius and a pressure higher than about 2 kbar. The method causes any spatial portion of the first side or the second side of the first seed plate or the first side or the second side of the second seed plate to change in character from an a-plane characteristic to an m-plane orientation characteristic. Preferably, the method also generally thickens each of the seed plates by way of crystal growth.

Benefits are achieved over pre-existing techniques using the present invention. In particular, the present invention enables a cost-effective high pressure apparatus for growth of crystals such as GaN, AlN, InN, InGaN, and AlInGaN and others. In a specific embodiment, the present method and apparatus can operate with components that are relatively simple and cost effective to manufacture. Depending upon the embodiment, the present apparatus and method can be manufactured using conventional materials and/or methods according to one of ordinary skill in the art. The present apparatus and method enable cost-effective crystal growth and materials processing under extreme pressure and temperature conditions in batch volumes larger than 0.3 liters, larger than 1 liter, larger than 3 liters, larger than 10 liters, larger than 30 liters, larger than 100 liters, and larger than 300 liters according to a specific embodiment. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1a and 1b are crystal growth frame structures according to embodiments of the present invention.

FIGS. 2a, 2b, and 2c are crystal growth seed rack structures according to embodiments of the present invention.

FIGS. 3a and 3b are simplified diagrams illustrating processing methods for crystal growth apparatus according to embodiments of the present invention.

FIGS. 4a, 4b, and 4c are simplified diagrams illustrating crystal growth processes according to embodiments of the present invention.

FIG. 5 is a simplified diagram of flow chart illustrating a crystal growth process according to an embodiment of the present invention.

FIGS. 6a and 6b are simplified diagrams illustrating a recycling operation for crystal growth according to embodiments of the present invention.

DETAILED DESCRIPTION OF THE INVENTION

According to the present invention, techniques related to processing of materials for growth of crystal are provided. More particularly, the present invention provides a method for obtaining a gallium-containing nitride crystal by an ammonobasic or ammonoacidic technique, but there can be others. In other embodiments, the present invention provides an apparatus for large scale processing of nitride crystals, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In the discussion that follows, the present apparatus is described as being vertically oriented. In another embodiment, the apparatus is instead horizontally oriented or oriented at an oblique angle intermediate between vertical and horizontal, and may be rocked so as to facilitate convection of the supercritical fluid within the high pressure apparatus. The present methods may be used in conjunction with a sealable container and high pressure apparatus. Examples of representative applicable apparatus are described in U.S. Pat. Nos.

7,101,433, 7,125,453, and 7,160,388, in U.S. Published Patent Application No. 200601777362, and in U.S. Patent Application No. 61/073,687, Ser. Nos. 12/133,365 and 12/133,364, all of which are hereby incorporated by reference in their entirety. Reference should also be made to FIG. 5, which lists the general steps for carrying out a process of crystal growth according to an embodiment of the present invention. As shown, FIG. 5 is merely an illustration and should not unduly limit the scope of the claims herein. One of ordinary skill in the art would recognize other variations, modifications, and alternatives.

A schematic of a frame for seed crystals and raw material is shown in FIGS. 1*a* and 1*b*. The frame enables seed crystals and raw material to be loaded into a suitable configuration for crystal growth prior to placement inside a high pressure apparatus and in a form that is convenient for subsequent handling. The frame should retain good rigidity under crystal growth conditions and be chemically inert to the crystal growth environment, neither contributing contamination to the growing crystals nor undergoing significant corrosion. The materials of construction of the frame and the components thereof may include one or more of copper, copper-based alloy, gold, gold-based alloy, silver, silver-based alloy, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, silica, alumina, combinations thereof, and the like. Iron-base alloys that may be used to form the frame include, but are not limited to, stainless steels. Nickel-base alloys that may be used to form the frame include, but are not limited to, inconel, hastelloy, and the like. Again, there can be other variations, modifications, and alternatives. In some embodiments, the components of the frame are fabricated from an alloy comprising at least two elements, for increased hardness and creep resistance. The frame and its components may comprise wire, wire cloth or mesh, foil, plate, sheet, square bar, round bar, rectangular bar, tubing, threaded rod, and fasteners. The frame and its components may be attached by means of welding, arc welding, resistance welding, ultrasonic welding, brazing, clamping, attachment by means of fasteners such as at least one of screws, bolts, threaded rod, and nuts, and the like.

The frame may include, as components, a baffle, a raw material basket, and a rack for suspending seed crystal plates, plus a means for attaching at least two of the aforementioned components. In one set of embodiments, illustrated in FIG. 1*a*, appropriate for the case where the crystal to be grown has a solubility that increases with increasing temperature, the basket is positioned below the baffle and the seed rack is positioned above the baffle. In another set of embodiments, illustrated in FIG. 1*b*, appropriate for the case where the crystal to be grown has a solubility that decreases with increasing temperature, i.e., retrograde solubility, the basket is positioned above the baffle and the seed rack is positioned below the baffle. A larger volume may be provided for the crystal growing region, that is, the region containing the seed rack, than for the nutrient region, that is, the region containing the basket. In one specific embodiment, the ratio of the volumes of the crystal growing region and the nutrient region is between 1 and 5. In other embodiments, this ratio is between 1.25 and 3, or between 1.5 and 2.5. The overall diameter and height of the frame are chosen for a close fit within the high pressure apparatus, so as to maximize the utilization of the available volume and optimize the fluid dynamics. The diameter of the frame may be between 1 inch and 2 inches, between 2 inches and 3 inches, between 3 inches and 4 inches, between 4 inches and 6 inches, between 6 inches and 8 inches, between 8 inches and 10 inches, between 10 inches and 12 inches, between 12 inches and 16 inches, between 16 inches and 24 inches, or greater than 24 inches. The ratio of the overall height of the frame to its diameter may be between 1 and 2, between 2 and 4, between 4 and 6, between 6 and 8, between 8 and 10, between 10 and 12, between 12 and 15, between 15 and 20, or greater than 20.

The baffle provides a means for dividing the high pressure apparatus into which the frame is to be inserted into two separate regions, and comprises one or more disks. The two regions are in fluid communication with each other, as the baffle has a plurality of through-holes, or openings. Thus, a fraction of the cross-sectional area of the baffle is open. In a specific embodiment, the baffle has a fractional open area of between about 0.5% and about 30%, but can also have other percentages. In other embodiments, the baffle has a fractional open area between 2% and 20%, or between 5% and 15%. Baffle serves the purpose of confining the at least one (or more) source material to a specific region or end of chamber 108 while permitting solvent and, under high pressure high temperature (HPHT) conditions, supercritical fluid, to migrate throughout the high pressure apparatus by passing freely through through-holes in baffle. Often times, this feature is particularly useful in applications such as crystal growth, in which the supercritical fluid transports the at least one material, a nutrient material, from one region of the chamber, defined by placement of baffle, to another region where crystal growth on seed crystals take place. In one specific embodiment, the diameter of the baffle is equal to the maximum diameter of the overall frame. In other embodiments, the diameter of the baffle is slightly less than the maximum diameter of the overall frame, providing an annular space through which fluid can flow under crystal growth conditions. The diameter of the baffle may be less than the maximum diameter of the overall frame by 0.5 inch or less. The openings in the baffle should be large enough so as not to clog readily. In one specific embodiment, the diameters of the openings in the baffle are between 0.020 inch and 0.5 inch. In another embodiment, the diameters of the openings in the baffle are between 0.050 inch and 0.25 inch. In one specific embodiment, the baffle comprises a single disk with a thickness between 0.020 inch and 0.5 inch. In another embodiment, the baffle comprises a single disk with a thickness between 0.050 inch and 0.25 inch. In some embodiments, the baffle comprises two disks, three disks, or more. In some multi-disk embodiments one or more of the openings in the disks lie above one another. In other multi-disk embodiments, one or more of the openings in the disks do not lie above one another. The effective fractional open area in multi-disk baffle embodiments may therefore lie between the fractional open area of each disk, as an upper bound, and the product of the fractional open areas of each disk.

The raw material basket provides a convenient means for transferring the raw material, including source material and mineralizer, into the high pressure apparatus, for permitting facile fluid communication from the region between source material particles within the basket and the crystal growth region, and for removing un-consumed source material from the reactor at the conclusion of a growth run. In one embodiment, the basket comprises wire mesh or wire cloth, as indicated schematically in the Figures. The diameter of the wire in the mesh or cloth may be between 0.001 inch and 0.25 inch, between 0.005 inch and 0.125 inch, or between 0.010 inch and 0.080 inch. The wire mesh or wire cloth may be contained within and, optionally, attached to a frame comprising larger-diameter wire so as to provide improved mechanical support. In another embodiment, the basket comprises foil or plate with a plurality of through-holes or openings. The size of the openings in the wire mesh, wire cloth, or foil or plate should be small enough so that raw material particles do not pass through them during crystal growth, even after a significant portion of the raw material has been etched and/or consumed by the crystal growth operation. In one specific embodiment, the openings in the wire mesh, wire cloth, or foil or plate have a diameter between 0.005 inch and 0.5 inch. In other embodiments, the openings have a diameter between 0.010 inch and 0.125 inch, or between 0.025 inch and 0.080 inch. In some embodiments, hollow pipes, with openings that are covered by wire mesh, are placed within the basket prior to loading of the raw material so as to improve fluid communication between the region between raw material particles within the basket and the crystal growth region. Suitable configurations for such hollow pipes are taught by U.S. Pat. No. 3,245,760, which is hereby incorporated by reference in its entirety.

In some embodiments, the source material is placed in the basket prior to placement of seed crystals on the seed rack, so as to minimize the likelihood of breakage of the latter. The source material may be supplied in various forms. In some embodiments, the source material comprises single crystals or chunks or grit of polycrystalline material. In other embodiments, the source material comprises chunks of sintered polycrystalline material. In the case of gallium nitride, the source material may be derived from by-product single- or poly-crystalline GaN deposited on the wall or miscellaneous surfaces with a hydride vapor phase epitaxy (HVPE) reactor. In another specific embodiment, the source material comprises plates of single- or poly-crystalline GaN grown on a substrate by HVPE. In another specific embodiment, the source material is derived from sintered GaN powder, as disclosed by U.S. Pat. No. 6,861,130, which is hereby incorporated by reference in its entirety. In another specific embodiment, the source material is derived from polycrystalline GaN plates comprising a columnar microstructure, as disclosed by US patent application 2007/0142204A1, which is hereby incorporated by reference in its entirety. The source material may contain oxygen at a concentration below $10^{19}$ cm$^{-3}$, below $10^{18}$ cm$^{-3}$, or below $10^{17}$ cm$^{-3}$. The source material may contain an n-type dopant, such as Si or O, a p-type dopant, such as Mg or Zn, a compensatory dopant, such as Fe or Co, or a magnetic dopant, such as Fe, Ni, Co, or Mn, at concentrations between $10^{16}$ cm$^{-3}$ and $10^{21}$ cm$^{-3}$. In one specific embodiment, the particle size distribution of the source material lies between about 0.020 inch and about 5 inches. In another embodiment, the particle size distribution of the source material lies between about 0.050 inch and about 0.5 inch. In a preferred embodiment, the total surface area of the source material is greater, by at least a factor of three, than the total surface area of all the seed crystal plates that are placed in the seed rack.

In some embodiments, the source material comprises a metal that will become molten at elevated temperatures, for example, gallium or indium. In some embodiments, the mineralizer comprises a metal that will become molten at elevated temperatures, for example, sodium, potassium, or lithium. If placed in direct contact with the inner surface of an autoclave or a capsule, the metal may form an alloy, compromising the integrity of the autoclave or capsule. In some embodiments, therefore, at least one crucible is placed within or proximate to the raw material basket and contains at least one metal. The crucible should be chemically inert with respect to the supercritical fluid crystal growth environment and should not react or alloy with the at least one metal. In one specific embodiment, the crucible comprises molybdenum, tantalum, niobium, iridium, platinum, palladium, gold, silver, or tungsten. In another specific embodiment, the crucible comprises alumina, magnesia, calcia, zirconia, yttria, aluminum nitride or gallium nitride. The crucible may comprise a sintered or other polycrystalline material.

The seed rack provides a convenient means for transferring the seed crystals or plates into the high pressure apparatus, for permitting facile fluid communication between the seed crystals or plates and the nutrient region on the other side of the baffle, and for removing the grown crystals from the reactor at the conclusion of a growth run. The seed rack should be easy to load and unload, enable efficient usage of the available crystal growth volume, and minimize breakage and other yield losses of the crystals.

In preferred embodiments, the seed crystals or plates comprise gallium nitride. In other embodiments, the seed crystals or plates may comprise aluminum nitride, sapphire, silicon carbide, MgAl$_2$O$_4$ spinel, zinc oxide, or the like. The seed plates have a minimum lateral dimension of at least one centimeter. In some embodiments, the seed plates have a maximum lateral dimension of at least two centimeters and a minimum lateral dimension of at least one centimeter. In other embodiments, the seed plates have minimum lateral dimensions of at least three centimeters, at least four centimeters, at least five centimeters, at least six centimeters, at least eight centimeters, or at least ten centimeters. In some embodiments, the seed plates are bulk single crystals of gallium nitride. In some embodiments the seed plates are prepared from crystals that were grown by hydride vapor phase epitaxy. In other embodiments, the seed plates are prepared from crystals that were grown ammonothermally. In still other embodiments, the seed plates are prepared from crystals that were grown from solution in a flux. In one specific embodiment, the seed plates are prepared by the method disclosed in U.S. Patent Application No. 61/078,704, which is incorporated by reference herein. In some embodiments, the dislocation density at the large-area surfaces of the seed plates is less than about $10^6$ cm$^{-2}$. In some embodiments, the dislocation density at the large-area surfaces of the seed plates is less than about $10^5$ cm$^{-2}$, less than about $10^4$ cm$^{-2}$, less than about $10^3$ cm$^{-2}$, or less than about $10^2$ cm$^{-2}$. In some embodiments, the full width at half maximum of the x-ray diffraction line corresponding to the crystallographic orientation of the large-area face is less than 300 arc seconds, less than 150 arc seconds, less than 100 arc seconds, or less than 50 arc seconds.

Gallium nitride is a hexagonal, wurtzite-structure crystal (space group P6$_3$mc; point group 6 mm) with distinct growth sectors. Under a given set of growth conditions, growth occurs at different rates in the +c direction, the −c direction, the m directions, the a directions, and in other crystallographic directions. In general, fast-growing directions tend to grow themselves out of existence, so that the resulting crystals are terminated mainly by facets associated with the slower-growing directions. The most commonly occurring facets under ammonothermal growth conditions are c-plane (0 0 0 1) and (0 0 0 −1), and m-plane {1 −1 0 0}. Other planes, for example, a-plane {1 1 −2 0} and semi-polar {1 −1 0 −1} occur less frequently or with smaller areas. Manufacturing efficiency is enhanced by using seed crystals or plates that are already large in a relatively slow-growing dimension, and performing the predominant crystal growth in a relatively faster growing direction. In preferred embodiments, the large area faces of the seed plates are stable under the pre-selected growth conditions, i.e., do not facet, which is facilitated by selecting seed plates with (0 0 0 1), (0 0 0 −1), {1 −1 0 0}, {1 1 −2 0}, or {1 −1 0 −1} orientations.

In addition, the tendency for impurity uptake differs from one growth sector to another. For example, as shown by Frayssinet and co-workers, writing in the Journal of Crystal Growth, volume 230, pages 442-447 (2001), the concentration of free carriers, caused by point defects, is markedly different in the +c and −c growth sectors of unintentionally-doped bulk GaN crystals grown by a particular technique. Similar results have been reported by other authors, with the general tendency that the [0 0 0 −1], or −c, growth sector incorporates a higher impurity concentration than does the [0 0 0 1], or +c, growth sector. Differential impurity uptake is undesirable for at least two reasons. First, the presence of concentration gradients within crystals makes it more difficult for the crystal manufacturer to maintain consistent product specifications. Second, the presence of concentration gradients within the crystal generates strain (typically, impurities in GaN cause a slight increase in the lattice constants), which can lead to bow, cracking, dislocation generation, and other detrimental effects. Manufacturing efficiency, including yield, product quality, and product consistency, is enhanced by restricting the predominant crystal growth to occur in only one growth sector.

In one or more embodiments, manufacturing growth is desired to occur predominantly on m planes. For example, under a predetermined set of growth conditions crystal growth may occur more rapidly in the a direction than in the m direction, and more rapidly in the m direction than in the +c or −c directions. Under such a predetermined set of growth conditions, spontaneously nucleated and grown crystals will take the shape of hexagonal platelets, with large c facets and long m-plane-terminated side edges and a thickness that is less than the diameter. Growth in the m direction could also be preferred by virtue of improved crystallographic quality, reduced impurity incorporation, or, conversely, by increased capability for incorporation of dopants or band-gap modifiers such as Al or In. Growth in the m direction may also be ideal for producing m-plane-oriented wafers. Opposite faces on an m-plane oriented seed crystal or plate will both constitute m planes, so use of such a seed crystal would produce growth in a single crystallographic growth sector.

In one set of embodiments, the seed crystals are attached to the seed rack as shown schematically in FIGS. 2a and 2b. Individual seed crystals may be selected or cut to have approximately the same height, so that multiple seed crystals may be placed adjacent to one another in a tier of the seed rack. The seed crystals may have rectangular large-area faces. The seed crystals may be placed between upper and lower seed rack bars and held in place by means of clips. The clips may clamp the seed crystals by spring force, by virtue of the seed crystal being thicker than the separation between opposite sides of the clip when the latter is free standing and relaxed. In an alternative set of embodiments, the seed crystal is affixed to the clip by virtue of a fastener positioned proximate to the clip, seed crystal, and seed rack, such as a length of threaded rod with nuts on opposite ends. In yet another set of embodiments the clips are attached to the seed crystals first and then attached to the seed rack. In some embodiments, the clips have at least one opening through which the crystal can grow, so as to minimize strain and defect generation. In still another set of embodiments, the seed rack comprises recesses, slots, hollows, or the like, into which opposite ends of the seed crystals are slid. Pieces of foil may be placed between the seed crystals and the recesses in the seed rack so as to facilitate removal after crystal growth. In preferred embodiments, each seed crystal is attached to the seed rack in at least two positions, so as to minimize the likelihood of seed or crystal breakage before, during, or after crystal growth, and to hold the seed crystals accurately in the desired positions in the reactor. Adjacent seed crystals or plates may be separated by a crystal separator plate. The crystal separator plates may have holes that slide over the seed rack bar(s), may have slots that are open on one side so as to slide over the seed rack bar, or the like.

In some embodiments, holes or slots are provided in the seed crystals or plates, and the seed crystals or plates are suspended from the seed rack by at least one wire or foil strip. In some embodiments, the seed crystals are suspended by at least two wires or foil strips. The holes or slots in the seed crystals or plates may be formed by laser drilling or cutting, by ultrasonic drilling, by mechanical drilling or milling, by grinding, by sanding, by electric discharge machining, by water jet cutting, or the like.

In one set of embodiments, manufacturing growth is desired to occur predominantly on m planes. Growth in the m direction may provide a useful means for preparing non-polar substrate orientations. Growth in the a direction could also be preferred by virtue of improved crystallographic quality, reduced impurity incorporation, or, conversely, by increased capability for incorporation of dopants or band-gap modifiers such as Al or In. Opposite faces on an m-plane oriented seed crystal or plate will both constitute m planes, so use of such a seed crystal would produce growth in a single crystallographic growth sector.

In one set of embodiments, manufacturing growth is desired to occur predominantly on a planes. Growth in the a direction may provide a useful means for preparing non-polar and/or semi-polar substrate orientations. Growth in the a direction could also be preferred by virtue of improved crystallographic quality, reduced impurity incorporation, or, conversely, by increased capability for incorporation of dopants or band-gap modifiers such as Al or In. Opposite faces on an a-plane oriented seed crystal or plate will both constitute a planes, so use of such a seed crystal would produce growth in a single crystallographic growth sector.

In another set of embodiments, manufacturing growth is desired to occur predominantly on c planes, either in the +c direction (the [0 0 0 1] Ga-polar direction) or −c direction (the [0 0 0 −1] N-polar direction). For example, under a predetermined set of growth conditions crystal growth may occur more rapidly in the +c or −c direction than in the m direction. Under such a predetermined set of growth conditions, spontaneously nucleated and grown crystals will take the shape of hexagonal pillars, prisms, or needles, with small c facets and long m-plane-terminated side edges and a length that is less than the diameter. Growth in the +c or −c direction could also be preferred by virtue of improved crystallographic quality, reduced impurity incorporation, or, conversely, by increased capability for incorporation of dopants or band-gap modifiers such as Al or In. Growth in the +c or −c direction may also be ideal for producing c-plane-oriented wafers. Opposite faces on an c-plane oriented seed crystal or plate constitute different planes, so use of such a seed crystal alone would produce growth in two distinct crystallographic growth sectors. Growth in a single crystallographic growth sector may be achieved by stacking pairs of c-plane-oriented seed crystals or plates back to back, with like faces facing one another. For example, the −c face of two c-plane-oriented seed crystals or plates could be faced proximate to one another, so that the +c faces of the two c-plane-oriented seed crystals or plates face outward and would yield growth in a single crystallographic orientation. Conversely, the +c face of two c-plane-oriented seed crystals or plates could be faced proximate to one another, so that the −c faces of the two c-plane-oriented seed crystals or plates face outward and would yield growth in a single crystallographic orientation. The pairs of seed crystals could be placed in direct contact with one another or could be separated by a crystal separator plate. The pairs of seed crystals placed back to back may be separated by a predetermined gap. The predetermined gap may be, less than 5 millimeters, less than 2 millimeters, less than 1 millimeter, less than 0.3 millimeter, less than 0.1 millimeter, less than 0.03 millimeter, or less than 0.01 millimeter. The predetermined gap may be essentially zero, that is, with the seed crystals in direct contact. If the pairs of seed crystals or plates grew together during a growth run they could be separated after the run, if desired, or could be left together for use as a seed (bi-)crystal in a subsequent run. A c-plane-oriented bi-crystal, on which both large-area faces constitute +c or −c surfaces, is suitable for use as a seed, as growth on the large area faces will occur in only a single crystallographic direction. At least one contact twin or stacking fault, oriented substantially parallel to the large-area surfaces, may be present in the bi-crystal.

In yet another set of embodiments, manufacturing growth is desired to occur predominantly on the semi-polar $\{1 -1 0 -1\}$ plane. Growth in this semipolar direction could be preferred by virtue of improved crystallographic quality, reduced impurity incorporation, or, conversely, by increased capability for incorporation of dopants or band-gap modifiers such as Al or In. Growth perpendicular to the $\{1 -1 0 -1\}$ plane may also be ideal for producing $\{1 -1 0 -1\}$-oriented wafers. Opposite faces on an $\{1 -1 0 -1\}$-oriented seed crystal or plate constitute different planes, so use of such a seed crystal alone would produce growth in two distinct crystallographic growth sectors. Growth in a single crystallographic growth sector may be achieved by stacking pairs of $\{1 -1 0 -1\}$-oriented seed crystals or plates back to back, with the $\{1 -1 0 1\}$-oriented faces facing one another. The pairs of seed crystals could be placed in direct contact with one another or could be separated by a crystal separator plate. If the pairs of seed crystals or plates grew together during a growth run they could be separated after the run, if desired, or could be left together for use as a seed (bi-)crystal in a subsequent run. A $\{1 -1 0 -1\}$-oriented bi-crystal, on which both large-area faces constitute $\{1 -1 0 -1\}$ surfaces, is suitable for use as a seed, as growth on the large area faces will occur in only a single crystallographic direction. At least one contact twin, oriented substantially parallel to the large-area surfaces, may be present in the bi-crystal.

In still another set of embodiments, manufacturing growth is desired to occur predominantly on semi-polar planes. Semipolar planes may be designated by (hkil) Miller indices, where i=−(h+k), l is nonzero and at least one of h and k are nonzero. For example, growth on (1 0 −1 −1) planes may be preferred over growth on (1 0 −1 1) planes because of a higher growth rate, improved crystallographic quality, reduced impurity incorporation, or, conversely, by increased capability for incorporation of dopants or band-gap modifiers such as Al or In. Growth in semipolar directions may be ideal for producing semi-polar-oriented wafers. Opposite faces on a semi-polar oriented seed crystal or plate constitute different planes, so use of such a seed crystal alone would produce growth in two distinct crystallographic growth sectors. Growth in a single crystallographic growth sector may be achieved by stacking pairs of semi-polar-oriented seed crystals or plates back to back, with like faces facing one another. For example, the (1 0 −1 1) face of two semi-polar seed crystals or plates could be faced proximate to one another, so that the (1 0 −1 −1) faces of the two seed crystals or plates face outward and would yield growth in a single crystallographic orientation. More generally, the (h k i l) face of two semipolar seed crystals or plates could be placed proximate to one another, so that the (h k i −l) faces of the two seed crystals or plates face outward and would yield growth in a single crystallographic orientation. The pairs of seed crystals could be placed in direct contact with one another or could be separated by a crystal separator plate. If the pairs of seed crystals or plates grew together during a growth run they could be separated after the run, if desired, or could be left together for use as a seed (bi-)crystal in a subsequent run. A semi-polar bi-crystal, on which both large-area faces constitute the same semi-polar orientation, is suitable for use as a seed, as growth on the large area faces will occur in only a single crystallographic direction.

In some embodiments, the seed crystals or plates have a rectangular or approximately rectangular shape. An approximately rectangular shape may be particularly appropriate for m-plane or a-plane seed plates. In some embodiments, the corners of the seed crystals or plates are rounded or chamfered so as to minimize the likelihood of breakage. Rectangular shapes are convenient for mounting and for efficiently utilizing space within the high pressure crystal growth reactor. In other embodiments, the seed crystals or plates have a hexagonal or approximately hexagonal shape. A hexagonal shape may be particularly convenient when working with c-plane-oriented seed crystals or plates. In still other embodiments, the seed crystals or plates have a circular, oval, or approximately circular or oval shape.

In some embodiments, particularly those with non-rectangular seed crystals or plates, the seeds may be arranged in a non-rectangular, close-packed way, as shown in FIG. 2c. Rather than comprising linear arrays of bars arranged into multiple tiers stacked vertically, the seed rack may comprise a honeycomb-type arrangement, with hexagonal, circular, rectangular or other shape cutouts arranged in a regular pattern. The honeycomb structure may be formed from a sheet by wire electric discharge machining, water-jet cutting, milling, drilling, or the like. Alternatively, the honeycomb structure may be fabricated from bent quasi-horizontal bars attached with vertical reinforcement structures.

In some embodiments, particularly those involving the use of an autoclave as the high pressure apparatus, the frame further comprises a set of stacked disks or baffles on the top end of the frame. The stacked disks or baffles reduce convective heat transfer from the supercritical fluid during crystal growth to the upper end of the autoclave so that the seal of the autoclave may be at a reduced temperature relative to the upper end of the interior of the autoclave. In other embodiments, one or more disks or baffles are placed on top of the frame after insertion of the latter into a high pressure apparatus.

After loading the frame with seed crystals and raw material, the frame is placed inside a sealable container. The sealable container may constitute an autoclave or a capsule designed for use with an internally-heated high pressure apparatus. At least one mineralizer may be added. The mineralizer may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of HF, HCl, HBr, HI, Ga, and $NH_3$. The mineralizer may comprise other alkali, alkaline earth, or ammonium salts, other halides, urea, sulfur or a sulfide salt, or phosphorus or a phosphorus-containing salt. The mineralizer may be provided as a metal, a loose powder, as granules, or as at least one densified compact or pill. The mineralizer may be added to the raw material basket, may be placed in a crucible, or may be placed directly in the high pressure apparatus or capsule. In a preferred embodiment, the mineralizer is added to the high pressure apparatus or capsule in the absence of exposure to air, such as inside a glove box.

The sealable container is then closed and sealed except for a connection to a gas, liquid, or vacuum manifold. In one embodiment, the sealable container comprises an autoclave, as taught by U.S. Pat. No. 7,335,262, which is hereby incorporated by reference in its entirety. In another embodiment, the sealable container comprises a metal can, as discussed by U.S. Pat. No. 7,125,453, a container, as discussed by U.S. Patent Application No. 2007/0234946, or a capsule, as discussed by U.S. patent application Ser. No. 12/133,365, entitled "Improved capsule for high pressure processing and method of use for supercritical fluids," all of which are hereby incorporated by reference in their entirety. The inner diameter of the autoclave or capsule may be between 1 inch and 2 inches, between 2 inches and 3 inches, between 3 inches and 4 inches, between 4 inches and 6 inches, between 6 inches and 8 inches, between 8 inches and 10 inches, between 10 inches and 12 inches, between 12 inches and 16 inches, between 16 inches and 24 inches, or greater than 24 inches. The clearance between the inner diameter of the autoclave or capsule and the outer diameter of the frame may be between 0.005 inch and 1 inch, or between 0.010 inch and 0.25 inch. The ratio of the inner height of the autoclave or capsule to its inner diameter may be between 1 and 2, between 2 and 4, between 4 and 6, between 6 and 8, between 8 and 10, between 10 and 12, between 12 and 15, between 15 and 20, or greater than 20.

In some embodiments, the autoclave or capsule is evacuated, so as to remove air, moisture, and other volatile contaminants. In some embodiments, the high pressure apparatus or capsule is heated during evacuation, to a temperature between about 25 degrees Celsius and about 500 degrees Celsius. In some embodiments, the autoclave or capsule are heated using the same heating elements that are used during high pressure processing. In one specific embodiment, the capsule is heated by placing it inside an internally-heated pressure apparatus and heated using the heater for the latter.

In another set of embodiments, the autoclave or capsule containing the filled frame is purged to remove air, moisture, and other volatile contaminants, as shown in FIGS. 3a and 3b. Purging may provide for superior removal of air, moisture, and other volatile contaminants, relative to evacuation, because of the limited conductance through a tube or long hole to the interior of the autoclave or capsule. The autoclave or capsule is then coupled to a gas source by means of at least one fill tube or purge tube, preferably without exposing the contents of the capsule to air according to a specific embodiment. The gas source may comprise at least one of nitrogen, argon, hydrogen, helium, and solvent vapor, among others. In an embodiment, both a first fill or purge tube and a second fill or purge tube are coupled to a gas source and/or exhaust. In another embodiment, an inner purge tube is placed inside the fill or outer purge tube and positioned so that one end is proximate to the bottom end of the autoclave or capsule. The inner purge tube and outer purge tube may be fabricated from at least one of copper, copper-based alloy, gold, gold-based alloy, silver, silver-based alloy, palladium, platinum, iridium, ruthenium, rhodium, osmium, iron, iron-based alloy, nickel, nickel-based alloy, molybdenum, and combinations thereof. Iron-base alloys that may be used to form the inner purge tube or outer purge tube include, but are not limited to, stainless steels. Nickel-base alloys that may be used to form the inner purge tube or outer purge tube include, but are not limited to, inconel, hastelloy, and the like. The outer diameter of the inner purge tube may be less than the inner diameter of the fill or outer purge tube by at least 0.010 inch, as shown. The inner purge tube may be coupled to the fill or outer purge tube by means of a tee fitting or other suitable technique, so that purge gas introduced through the inner purge tube will exit near the bottom end of the autoclave or capsule, pass through the length of the autoclave or capsule before exhausting though the annular space in the fill or outer purge tube outside the inner purge tube and the tee fitting, providing for efficient removal of gas phase contaminants according to a specific embodiment. The interface between the tee fitting and the inner purge tube may be a sliding seal, for example, an O-ring or a differentially-pumped set of Teflon seals or O-rings. The rate of flow of the purge gas may be in the range between 0.05 and 10 standard liters per minute. The autoclave or capsule may be heated, for example, to a temperature between 25 degrees Celsius and 500 degrees Celsius during the purge operation, in order to more efficiently remove water and other adsorbed contaminants. After shutting off flow of the purge gas, solvent vapor, for example, gas phase ammonia, may be flowed through the autoclave or capsule in order to remove most or all of the purge gas.

In a specific embodiment, the inlet of the gas flow, for example, the second fill tube or the purge tube is then coupled to a source of liquid solvent. The autoclave or capsule and fill tube(s) may be cooled, or the liquid solvent delivery system and transfer lines heated, so that the former are cooler by between one and 50 degrees Celsius than the latter. Liquid solvent is then introduced into the autoclave or capsule at a rate between 0.1 and 1000 grams per minute. At room temperature, the vapor pressure of ammonia is approximately 10 atmospheres. Depending on the temperature of the solvent source, therefore, the system pressure during solvent delivery may be above 7 atmospheres, above 8 atmospheres, above 9 atmospheres, or above 10 atmospheres. In one embodiment, the purge exhaust is closed and the solvent vapor above the liquid is forced to condense into liquid during the filling operation. In this embodiment, the autoclave or capsule may be actively cooled in order to dissipate the heat released by condensation of the solvent vapor. In another embodiment, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the autoclave or capsule may be determined by using a liquid delivery system with the capability for accurately monitoring and controlling the mass of liquid delivered. An example of suitable equipment for delivery of precision-metered, high-purity liquid ammonia is the InScale™ system manufactured by iCon Dynamics, LLC. In some embodiments, the amount of ammonia delivered to the autoclave or capsule is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the autoclave or capsule. An analogous method for determining the quantity of vented solvent may be performed in cases where the solvent is different from ammonia.

In an alternative embodiment, the solvent is delivered to the autoclave or capsule as a vapor at elevated pressure. The inlet of the gas flow, for example, the second fill tube or the purge tube is then coupled to a source of vapor-phase solvent. The autoclave or capsule and fill tube(s) may be cooled, or the solvent delivery system and transfer lines heated, so that the former are cooler by between one and 50 degrees Celsius than the latter. Vapor-phase solvent is then introduced into the autoclave or capsule at a rate between 0.1 and 1000 grams per minute and allowed to condense in the autoclave or capsule. The pressure of the solvent vapor should be higher than the equilibrium vapor pressure at the temperature of the autoclave or capsule. Depending on the temperature of the autoclave or capsule and of the solvent delivery system, the pressure during solvent delivery may be above 7 atmospheres, above 8 atmospheres, above 9 atmospheres, or above 10 atmospheres. In one embodiment, the purge exhaust is closed and the solvent vapor above the liquid is forced to condense into liquid during the filling operation. In this embodiment, the autoclave or capsule may be actively cooled in order to dissipate the heat released by condensation of the solvent vapor. In another embodiment, the purge exhaust is fitted with a check valve so that residual purge gas or solvent vapor is allowed to exit when the pressure exceeds a predetermined threshold, but air or other gases are not allowed to flow backward into the autoclave. The quantity of solvent in the autoclave or capsule may be determined by using a vapor delivery system equipped with a mass flow meter. In some embodiments, the amount of ammonia delivered to the autoclave or capsule is quantified by the loss in weight of at least one ammonia supply cylinder. If solvent gas is allowed to exhaust during liquid filling, in the case where ammonia is the solvent, the quantity of vented solvent may be determined by trapping it in aqueous solution and measuring the change in pH and this quantity subtracted from the total liquid delivered to determine the quantity of liquid in the capsule. An analogous method for determining the quantity of vented solvent may be performed in cases where the solvent is different from ammonia.

Following filling of the autoclave or capsule, the inner purge tube, if present, may be removed. In some embodiments, the inner purge tube is removed after the purging step but before the filling step. A gate valve to the autoclave, or the fill tube(s) to the capsule, are then sealed. Once sealed, the interior of the autoclave or of the capsule is substantially air-free, and the at least one material contained therein can be processed with reduced risk of contamination. Of course, there can be other variations, modifications, and alternatives.

In some embodiments, the autoclave is then heated to crystal growth conditions. In other embodiments, the capsule is placed inside an autoclave, an internally-heated pressure apparatus, or other high pressure apparatus, and heated to crystal growth conditions. In some embodiments, the thermal cycle includes a pre-reaction segment to form mineralizer, polycrystalline gallium nitride, dissolved gallium containing complexes, or the like. In some embodiments, the atmosphere in the autoclave may be modified during the run. For example, excess $H_2$ formed by reaction of gallium metal with ammonia may be bled off through the gate valve or allowed to diffuse through a heated palladium membrane. Excess nitrogen formed by decomposition of an azide mineralizer may be bled off through the gate valve. Additional ammonia may be added to replenish the solvent in the high pressure apparatus.

Suitable thermal cycles for crystal growth are discussed by U.S. Pat. Nos. 6,656,615 and 7,078,731, which are hereby incorporated by reference in their entirety. The crystals grow predominantly perpendicular to the large-diameter faces, but may also grow somewhat in lateral directions as well. With the possible exception of c-plane or {1 –1 0 ±1} seeds stacked back-to-back, the crystals are prevented from growing into one another by the crystal separator plates.

After performing crystal growth for a predetermined period of time, the autoclave or high pressure apparatus is cooled. When the autoclave or capsule has cooled to below 100 degrees Celsius, below 75 degrees Celsius, below 50 degrees Celsius, or below 35 degrees Celsius, a valve to the autoclave is opened, or the capsule is vented, and the ammonia is removed. In one embodiment, gas-phase ammonia is allowed to exit the autoclave or capsule and is bubbled through an acidic aqueous solution in order to be chemically trapped. In another embodiment, gas phase ammonia is passed through a flame so as to burn the ammonia, forming $H_2O$ and $N_2$. In a preferred embodiment, illustrated in FIGS. 6a and 6b, the ammonia is trapped for recycling and reuse.

Referring to FIG. 6a, appropriate for a single-ended autoclave or capsule, the ammonia may be removed as either a liquid or a gas. To remove the ammonia as a liquid, the inner purge tube (see FIG. 3a 3b) is re-inserted into the outer purge or fill tube and the outlet of the inner purge tube connected to the Receiving/Purification tank. Keeping the purge gas exhaust connection (see FIGS. 3a and 3b) closed, a valve in the line to the inner purge tube is opened, allowing liquid ammonia to flow through the inner purge tube in the autoclave into the Receiving/Purification tank, which is otherwise closed. The Receiving/Purification tank may be cooled, for example, by chilled water, and/or the autoclave or capsule and transfer line may be heated during the ammonia transfer operation, so as to maintain a higher vapor pressure of ammonia in the autoclave as compared to the vapor pressure in the Receiving/Purification tank. The temperature differential between the autoclave or capsule and the Receiving/Purification tank may be held between one and 50 degrees Celsius. In another embodiment, the ammonia is removed as a vapor. The outlet of the autoclave or capsule is connected to a condenser above the Receiving/Purification tank and a valve opened. Gas-phase ammonia enters the condenser and condenses into liquid in a heat-exchanger, for example, a chilled-water-cooled coil, at a pressure between about 100 and 250 pounds per square inch. The autoclave and transfer line may be heated to a temperature that is higher than the condenser by between one and 50 degrees Celsius. Residual gases, for example, $N_2$ and $H_2$, may be released by venting to a scrubber and/or a flame.

Referring to FIG. 6b, appropriate for a double-ended autoclave or capsule, the ammonia may be removed as a liquid. A port on the bottom end of the autoclave or a fill tube on the bottom end of the capsule is connected to the Receiving/Purification tank and a valve opened, allowing liquid ammonia to flow into the Receiving/Purification tank, which is otherwise closed. The Receiving/Purification tank may be cooled, for example, by chilled water, and/or the autoclave and transfer line may be heated during the ammonia transfer operation, so as to maintain a higher vapor pressure of ammonia in the autoclave as compared to the vapor pressure in the Receiving/Purification tank. The temperature differential between the autoclave and the Receiving/Purification tank may be held between one and 50 degrees Celsius.

For recycling purposes, a purifying agent, for example, sodium metal, may be placed in the receiving/purification tank. The sodium will react with residual oxygen and/or water in the ammonia, restoring a very high degree of purity. After a period of one hour to thirty days, the ammonia may be transferred to a delivery tank. In a preferred embodiment, the transfer is performed through the gas phase, via a condenser, so as to leave the purifying agent in the receiving/purification tank. Liquid ammonia may be delivered from the delivery tank, via a dip tube, to the autoclave for the next crystal growth run. In an alternative embodiment, vapor-phase ammonia may be delivered from the delivery tank to an autoclave or capsule for the next crystal growth run.

After cooling, removal of the ammonia, and opening of the autoclave or internally-heated high pressure apparatus and capsule, the frame is removed from the autoclave or capsule, and the grown crystals are removed from the seed rack. If necessary, portions of the clips that have been overgrown by crystalline material may be removed by etching in an appropriate acid, such as at least one of hydrochloric acid, sulfuric acid, nitric acid, and hydrofluoric acid.

The crystals are sliced into pre-selected orientations, as summarized in FIGS. 4a, 4b, and 4c. In one embodiment, the seed crystals have an m-plane orientation and are sliced into m-plane-oriented wafers, as shown in FIG. 4a. In another embodiment, the seed crystals are +c or −c oriented (or are bi-crystals, as described above), and are sliced into c-plane-oriented wafers, as shown in FIG. 4b. In another embodiment, the seed crystals are {1 −1 0 −1} oriented and are sliced into {1 −1 0 ±1}-oriented wafers. In another embodiment, the seed crystals are m-plane oriented, and slices are made at an angle of approximately 28 degrees with respect to the large-area m plane to prepare semi-polar wafers with a {1 −1 0 ±1} orientation. In another embodiment, the seed crystals are {1 −1 0 −1} oriented, and slices are made at an angle of approximately 18.8 degrees with respect to the large area plane to prepare semi-polar wafers with a {1 −1 0 ±2} orientation. In another embodiment, the seed crystals are {1 −1 0 −1} oriented, and slices are made at an angle of approximately 29.9 degrees with respect to the large area plane to prepare semi-polar wafers with a {1 −1 0 ±3} orientation. In another embodiment, the seed crystals are {1 −1 0 −1} oriented, and slices are made at an angle of approximately 26.2 degrees with respect to the large area plane to prepare semi-polar wafers with a {1 1 −2 ±2} orientation. In another embodiment, the seed crystals are c-plane oriented, and slices are made at an angle of approximately 32 degrees with respect to the large-area c plane to prepare semi-polar wafers with a {1 −1 0 ±3} orientation. In another embodiment, the seed crystals are m-plane oriented, and slices are made at an angle of approximately 42.5 degrees with respect to the large-area m plane to prepare semi-polar wafers with a {1 1 −2 ±2} orientation. In still another embodiment, the seed crystals are c-plane oriented, and slices are made at an angle of approximately 43.2 degrees with respect to the large-area c plane to prepare semi-polar wafers with a {1 −1 0 ±2} orientation. In yet another embodiment, the seed crystals are c-plane oriented, and slices are made at an angle of approximately 62.0 degrees with respect to the large-area c plane to prepare semi-polar wafers with a {1 −1 0 ±1} orientation. In still another embodiment, the seed crystals are c-plane oriented, and slices are made at an angle of approximately 58.4 degrees with respect to the large-area c plane to prepare semi-polar wafers with a {1 1 −2 ±2} orientation. In another embodiment, the seed crystals are c-plane oriented, and slices are made at an angle of approximately 90.0 degrees with respect to the large-area c plane to prepare non-polar wafers with a {1 −1 0 0} orientation. In another embodiment, the seed crystals are c-plane oriented, and slices are made at an angle of approximately 90.0 degrees with respect to the large-area c plane to prepare non-polar wafers with a {1 1 −2 0} orientation.

In other embodiments, the seed crystals have a crystallographic orientation such that at least one large face is a relatively fast-growing face. In one specific embodiment, the seed crystal has an a-plane orientation. In other embodiments, the seed crystal has a semi-polar orientation. In specific embodiments, the orientation of the seed crystal is {1 −1 0 ±1}, {1 −1 0 ±2}, {1 −1 0 ±3}, or {1 1 −2 ±2}. In some embodiments, two seed crystals are placed together back-to-back, so that opposite faces of the co-mounted seed crystals have an equivalent crystallographic orientation. The use of fast-growing orientations may allow for an overall faster production rate of high quality production crystals. In one specific embodiment, shown in FIG. 4c, the seeds are a-plane oriented. Initially rapid growth in the a direction slows as m-planes form near the top and bottom edges of the crystals. At the end of the crystal growth cycle, the crystal is terminated by four large-area m-plane facets, shown in edge section in FIG. 4c. From geometry, the m-plane facets are approximately 58% of the length of the initial a-plane seed plate. The crystal may be sliced at an angle to produce a plurality of m-plane crystals. In other embodiments, the crystal is sliced at other angles to produce c-plane wafers, a-plane wafers, or semi-polar wafers. The semi-polar wafers may have a {1 −1 0 ±1} orientation, a {1 −1 0 ±2} orientation, a {1 −1 0 ±3} orientation, or a {1 1 −2 ±2} orientation.

After slicing, the crystal wafers may be lapped, polished, and chemical-mechanically polished by methods that are known in the art.

The crystal wafers are useful as substrates for fabrication into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for photoelectrochemical water splitting and hydrogen generation.

In a specific embodiment, any of the above sequence of steps provides a method according to an embodiment of the present invention. In a specific embodiment, the present invention provides a method and resulting crystalline material provided by a pressure apparatus having a basket structure. Other alternatives can also be provided where steps are added, one or more steps are removed, or one or more steps are provided in a different sequence without departing from the scope of the claims herein.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for growth of a wurtzite crystallographic structure gallium-containing nitride bulk crystal, the method comprising:
providing at least one gallium-containing nitride seed characterized by a wurtzite crystallographic structure, wherein,
the at least one seed comprises a first growth surface facing in a first direction;
a second growth surface facing in a second direction;
the second direction is opposite the first direction;
the first growth surface and the second growth surface have a substantially equivalent crystallographic orientation; and the crystallographic orientation is within five degrees of a crystallographic plane selected from the (0 0 0 1) Ga-polar c-plane, the (0 0 0 −1) N-polar c-plane, and a semi-polar plane;

mounting the at least one gallium-containing nitride seed in an ammonothermal processing chamber; and growing a crystalline gallium-containing nitride material from the supercritical solution on the first growth surface and on the second growth surface of the at least one seed to form a wurtzite crystallographic structure gallium-containing nitride bulk crystal.

2. The method of claim 1, comprising increasing a thickness of the seed by at least 1 millimeter.

3. The method of claim 1, comprising increasing a thickness of the seed by at least 2 millimeters.

4. The method of claim 1, wherein the first growth surface and the second growth surface have a crystallographic orientation within five degrees of the (0 0 0 1) Ga-polar c-plane.

5. The method of claim 1, wherein the first growth surface and the second growth surface have a crystallographic orientation within five degrees of the (0 0 0 −1) N-polar c-plane.

6. The method of claim 1, wherein the first growth surface and the second growth surface have a crystallographic orientation within five degrees of the {1 −1 0 +1} semi-polar plane.

7. The method of claim 1, wherein the first growth surface and the second growth surface have a crystallographic orientation within five degrees of the {1 −1 0 −1} semi-polar plane.

8. The method of claim 1, wherein the first growth surface and the second growth surface have a minimum lateral dimension of three centimeters.

9. The method of claim 1, wherein the seed comprises a bi-crystal.

10. A method for growth of a wurtzite crystallographic structure gallium-containing nitride bulk crystal, the method comprising:

providing a gallium-containing nitride seed, wherein the seed comprises a first gallium-containing nitride seed plate and a second gallium-containing nitride seed plate, wherein, the first gallium-containing nitride seed plate comprises a first surface, a second surface, and a thickness separating the first surface and the second surface, wherein the first surface is opposite the second surface;

the second gallium-containing nitride seed plate comprises a first surface, a second surface, and a thickness separating the first surface and the second surface;

the second surface of the first seed plate faces and is proximate the second surface of the second seed plate;

the first surface of the first seed plate faces in an opposite direction to the first surface of the second seed plate;

the first surface of the first seed plate and the first surface of the second seed plate have an equivalent crystallographic orientation; and the crystallographic orientation is within five degrees of a crystallographic plane selected from the (0 0 0 1) Ga-polar c-plane, the (0 0 0 −1) N-polar c-plane, and a semi-polar plane;

mounting the at least one gallium-containing nitride seed in an ammonothermal processing chamber; and growing crystalline gallium-containing nitride material from the supercritical solution on the first surface of the first seed plate and on the first surface of the second seed plate to provide a wurtzite crystallographic structure gallium-containing nitride bulk crystal.

11. The method of claim 10, wherein, the first surface of the first seed plate and the first surface of the second seed plate have a crystallographic orientation to within 5 degrees of the (0 0 0 1) Ga-polar c-plane.

12. The method of claim 10, wherein, the first surface of the first seed plate and the first surface of the second seed plate have a crystallographic orientation to within 5 degrees of the (0 0 0 −1) N-polar c-plane.

13. The method of claim 10, wherein, the first surface of the first seed plate and the first surface of the second seed plate have a crystallographic orientation to within 5 degrees of the semi-polar {1 −1 0 −1} orientation.

14. The method of claim 10, wherein, the first surface of the first seed plate and the first surface of the second seed plate have a crystallographic orientation to within 5 degrees of the semi-polar {1 −1 0 +1} orientation.

15. The method of claim 10, wherein the second surface of the first seed plate and the second surface of the second seed plate are separated by less than 1 millimeter.

16. The method of claim 10, wherein the second surface of the first seed plate and the second surface of the second seed plate are in direct contact.

* * * * *